United States Patent
Narain et al.

(10) Patent No.: US 6,651,228 B1
(45) Date of Patent: Nov. 18, 2003

(54) INTENT-DRIVEN FUNCTIONAL VERIFICATION OF DIGITAL DESIGNS

(75) Inventors: Prakash Narain, San Carlos, CA (US); Rajiv Kumar, Santa Clara, CA (US); John M. Beardslee, Menlo Park, CA (US); Rajeev K. Ranjan, Santa Clara, CA (US); Christopher R. Morrison, Sunnyvale, CA (US)

(73) Assignee: Real Intent, Inc., Santa Clara, CA (US)

( * ) Notice: Subject to any disclaimer, the term of this patent is extended or adjusted under 35 U.S.C. 154(b) by 0 days.

(21) Appl. No.: 09/566,684

(22) Filed: May 8, 2000

(51) Int. Cl.$^7$ ................................................ G06F 17/50
(52) U.S. Cl. .............................................. 716/5; 716/4
(58) Field of Search .................................. 716/4–6, 18

(56) References Cited

U.S. PATENT DOCUMENTS

| | | | | |
|---|---|---|---|---|
| 5,517,432 A | * | 5/1996 | Chandra et al. | 364/578.1 |
| 5,604,895 A | * | 2/1997 | Raimi | 395/500 |
| 5,680,332 A | * | 10/1997 | Raimi et al. | 364/578 |
| 5,774,370 A | * | 6/1998 | Giomi | 716/4 |
| 6,175,946 B1 | | 1/2001 | Ly et al. | 716/4 |
| 6,182,268 B1 | * | 1/2001 | McElvain | 716/1 |

FOREIGN PATENT DOCUMENTS

EP   PCT/US 01/14973   3/2002

OTHER PUBLICATIONS

Chang et al, "Verification of a Microprocessor Using Real World Applications," IEEE, Jun. 1999, pp. 181–184.*
Golberg et a, "Combinational Verification Based on High–Level Functional Specifications," IEEE, Jan. 1998, pp. 1–6.*
Eijk et al, "Exploiting Functional Dependencies in Finite State Machine Verification," IEEE, 1996, pp. 9–14.*
York et al, "An Integrated Environment for HDL Verification," IEEE, 1995, pp. 9–18.*
Richard Goering, "Verification Start–Up Seeks Design Intent", EE Times, Apr. 24, 2000, 2 pages.
Gale Morrison, "Shrinking Design Times", Electronic News, May 1, 2000, 3 pages.
Narain et al., "A High–Level Approach to Test Generation", Jul. 1993, pp. 483–492.
Brand et al., "Incremental Synthesis", 1994, pp. 14–18.
"Time Rover: The Formal Testing Company", Nov. 17, 1997, p. 1.
"Solidification: Static Functional Verification with Solidify", 1999, pp. 1–10.
"Solidify: Static Functional Verification for HDL Designers", Mar. 1999, 2 pages.
"New Cadence Verification Product and Methodology Services Deliver Breakthrough Productivity for SOC Verification", Downloaded from http://www.cadence.com/press_box/na/pr/1999/06_07_99.html on Jun. 1999, pp. 1–3.

(List continued on next page.)

*Primary Examiner*—Vuthe Siek
(74) *Attorney, Agent, or Firm*—Faegre & Benson LLP

(57) ABSTRACT

A method and apparatus are provided that facilitate analysis of the intended flow of logical signals between key points in a design. According to one aspect of the present invention, hardware design defects can be detected using a novel Intent-Driven Verification process. First, a representation of a hardware design and information regarding the intended flow of logical signals among variables in the representation are received. Then, the existence of potential errors in the hardware design may be inferred based upon the information regarding the intended flow of logical signals by (1) translating the information regarding the intended flow of logical signals into a comprehensive set of checks that must hold true in order for the hardware design to operate in accordance with the intended flow of logical signals, and (2) determining if any of the checks can be violated during operation of circuitry represented by the hardware design.

165 Claims, 23 Drawing Sheets

OTHER PUBLICATIONS

"Formalized Design", Downloaded from http://www.formalized.com/prod.html on Jul. 1999, p. 1.

"Specman Elite Data Sheet", Downloaded from http://www.verisity.com/html/default_productspecman.html on Jul. 1999, pp. 1–2.

"0–In Methodology Overview", Downloaded from http://www.0–in.com/subpages/prodtech/index.html on Jul. 1999, pp. 1–2.

"Design INSIGHT Formal Model Checker", Downloaded from http://www.chrysalis.com/products/FMC_datasheet.htm on Jul. 1999, pp. 1–4.

"Design Insight FDRC Formal Design Rule Check Tools", Downloaded from http://www.chrysalis.com/products/FDRC_datasheet.htm on Jul. 1999, pp. 1–3.

"Datasheet: Affirma FormalCheck model checker", 1 page. No Date.

"Datasheet: Affirma Coverage Analyzer", 1 page. No Date.

"Assertion Compiler: Finds Hidden Bugs In Verilog And VHDL Designs", 1999, 2 pages.

"SureThing: The Designer's Workbench", 2 pages. No Date.

"Twister: Automatic Model Checker Formal Verification of Designs Using Predefined Rules", 2 pages. No date.

"0–In Search Data Sheet", pp. 1–3. No date.

"0–In CheckerWare Data Sheet", pp. 1–2 No date.

"0–In Check Data Sheet", pp. 1–3. No date.

"0–In Design Automation Home Page", Downloaded from http://www.0–in.com/ on May 8, 2000, 1 page.

"0–In Methodology Overview", Downloaded from http://www.0–in.com/subpages/prodtech/index.hmtl on May 8, 2000, 2 pages.

"0–In Check", Downloaded from http://www.0–in.com/subpages/prodtech/0in_check.html on May 8, 2000, 2 pages.

"0–In Technical Papers", Downloaded from http://www.0–in.com/subpages/prodtech/0in_related_techp-prs.html on May 8, 2000, pp. 1–3.

"0–In Search", Downloaded from http://www.0–in.com/subpages/prodtech/0in_search.html on May 8, 2000, pp. 1–2.

Anderson T., "Using VCS with White–Box Verification Techniques", SNUG San Jose 2000, pp. 1–9. No date.

Switzer et al., "Functional Verification with Embedded Checkers", 5 pages. No date.

Switzer et al., "Using Embedded Checkers to Solve Verification Challenges", pp. 1–20. No date.

"0–In Ships Industry's Fist White–Box Verification Tool," 0–In Design Automation, Inc.

Chandra, et al., "Architectural Verification of Processors Using Symbolic Instruction Graphs." Proceedings, IEEE International Conference on Computer Design: VLSI in Computers and Processors, Cambridge, Massachusetts, Oct. 10–12, 1994.

Keutzer, Kurt, "The Need for Formal Verification in Hardware Design and What Formal Verification Has Not Done for Me Lately." Proceedings of the 1991 International Workshop on the HOL Theorem Proving System and Its Applications, Davis, California, Aug. 28–30, 1991.

Levitt, et al., "A Scalable Formal Verification Methodology for Pipelined Microprocessors." Proceedings 1996 33rd Design Automation Conference, Las Vegas, Nevada.

Moundanos, et al., "Abstraction Techniques for Validation Coverage Analysis and Test Generation." IEEE Transactions on Computers, vol. 47, No. 1, Jan. 1998.

Jones, et al., "Self–Consistency Checking." Intl. Conf. On Formal Methods in Computer–Aided Design (PMCAD), 1996.

Naik, et al., "Modeling and Verification of a Real Life Protocol Using Symbolic Model Checking."

Eiriksson, et al., "Integrating Formal Verification Methods with a Conventional Project Design Flow." 33rd Design Automation Conference, Las Vegas, Nevada, Proceedings 1996.

Beer, et al., "Methodology and System for Practical Formal Verification of Reactive Hardware." 6th International Conference, CAV '94, Jun. 21–23, 1994.

Balarin, "Formal Verification of Embedded Systems Based on CFSM Networks." 33rd Design Automation Conference, Las Vegas, Nevada, Proceedings 1996.

Ho, Chain–Min Richard, "Validation Tools for Complex Digital Designs." Department of Computer Science and the Committee on Graduate Studies of Stanford University in Partial Fulfillment of the Requirements for the Degree of Doctor of Philosophy, Nov. 1996.

Burch, et al., "Automatic Verification of Pipelined Microprocessor Control." Conference on Computer–Aided Verification, Jun. 21–23, 1994.

Hoskote, et al., "Automatic Extraction of the Control Flow Machine and Application to Evaluating Coverage of Verification Vectors." International Conference on Computer Design:VLS in Computers & Processors, Oct. 2–4, 1995.

* cited by examiner

```
1.    define DEFAULT_MAX_ACCESS_TIME 1'b1
2.
3.    module main(clk, reset,
4.            dataA, clientRequestA, jobCompleteA, clientGrantA,
5.            dataB, clientRequestB, jobCompleteB, clientGrantB,
6.            dataC, clientRequestC, jobCompleteC, clientGrantC,
7.            memoryData);
8.
9.        input        clk, reset;
10.       input [0:0]  dataA, dataB, dataC;
11.       input        clientRequestA, clientRequestB, clientRequestC;
12.       input        jobCompleteA, jobCompleteB, jobCompleteC;
13.       output       clientGrantA, clientGrantB, clientGrantC;
14.       output [0:0] memoryData;
15.
16.       wire [0:0]   dataOutA, dataOutB, dataOutC;
17.
18.       // Put sentries at the boundary signals and make them active constantly.
19.
20.       // vx sentry dataA, dataB, dataC:clk;
21.       // vx always activate(dataA,dataB,dataC);
22.
23.       // Create three instances of the bus interface
24.
25.       BusInterface busInterfaceA(clk, reset, clientRequestA, JobCompleteA,
26.               dataA, dataOutA, requestA, grantA,
27.               clientGrantA);
28.
29.       BusInterface busInterfaceB(clk, reset, clientRequestB, jobCompleteB,
30.               dataB, dataOutB, requestB, grantB,
31.               clientGrantB);
32.
33.       BusInterface busInterfaceC(clk, reset, clientRequestC, JobCompleteC,
34.               dataC, dataOutC, requestC, grantC,
35.               clientGrantC);
36.
37.       RoundRobinArbiter arbiter(clk, reset,
38.               dataOutA, requestA, grantA,
39.               dataOutB, requestB, grantB,
40.               dataOutC, requestC, grantC,
41.               memoryData);
42.
43.   endmodule // main
```

*FIG. 9A*

```
44.   module BusInterface(clk, reset, clientRequest, jobComplete,
45.           data, dataOut, request, grant, clientGrant);
46.
47.           input          clk, reset, clientRequest, jobComplete;
48.           input [0:0]    data;
49.           output [0:0]   dataOut;
50.           // vx sentry dataOut:clk;
51.
52.           output         request;
53.           input          grant;
54.           output         clientGrant;
55.
56.           parameter      NO_REQ = 2'b00;
57.           parameter      REQ=2'b01;
58.           parameter      GRANTED = 2'b10;
59.
60.           reg [1:0] state, nextState;
61.           // vx flop state;
62.
63.           //assign request = ((state == REQ) || (state == GRANTED));
64.           assign request = ((state == REQ) || ((state == GRANTED) && !jobComplete));
65.           assign dataOut = data;
66.           assign clientGrant = grant;
67.
68.           always @(state or reset or clientRequest or jobComplete or grant)
69.           begin
70.                   if (reset)
71.                   begin
72.                           nextState = NO_REQ;
73.                           // vx deactivate(dataOut);
74.                   end
75.                   else
76.                   begin
77.                           nextState = state;
78.                           case (state)
79.                                   NO_REQ:
80.                                   begin
81.                                           // vx deactivate(dataOut);
82.                                           if (clientRequest) nextState = REQ;
83.                                   end
84.                                   REQ:
85.                                   begin
86.                                           // vx assert("env1", clientRequest && !jobComplete);
87.                                           if (grant) nextState = GRANTED;
88.                                   end
89.                                   VGRANTED:
90.                                   begin
91.                                           // vx activate(dataOut);
92.                                           // vx assert("env2", !clientRequest);
93.                                           if (jobComplete || 'grant)
94.                                                   nextState = NO_REQ;
95.                                   end
96.                           endcase // case(state)
97.                   end // else
98.           end // always
99.
100.          always @(posedge clk)
101.          state <= nextState;
102.  endmodule//BusInterface
```

*FIG. 9B*

```
103.    module RoundRobinArbiter(clk, reset,
104.            dataA, requestA, grantA,
105.            dataB, requestB, grantB,
106.            dataC, requestC, grantC,
107.            writeData);
108.
109.            input           clk, reset;
110.            input [0:0]     dataA, dataB, dataC;
111.            input           requestA, requestB, requestC;
112.            output          grantA, grantB, grantC;
113.            output [0:0]    writeData;
114.
115.            // vx sentry dataA, dataB, dataC: clk;
116.
117.            reg [0:0]       watchDogTimer, nextWatchDogTimer;
118.            reg [2:0]       state, nextState;
119.            // vx flop state, watchDogTimer;
120.            wire [0:0]      maxAccessTime;
121.
122.            parameter       idle = 3'b000;
123.            parameter       ready = 3'b001;
124.            parameter       stateA = 3'b010;
125.            parameter       stateB = 3'b011;
126.            parameter       stateC = 3'b100;
127.
128.            //next state logic
129.            always @(reset or requestA or requestB or requestC or state or watchDogTimer)
130.            begin
131.                    // vx deactivate(dataA,dataB,dataC);
132.                    if (reset) begin
133.                            nextState= idle;
134.                            nextWatchDogTimer = 1'b0;
135.                    end
136.            else begin
137.                            next8tate= idle; // default state
138.                            //by default timer should increment
139.                            nextWatchDogTimer = watchDogTii-ner+1'bl;
```

FIG. 9C

```
140.
141.                    case (state)
142.                    idle:
143.                    begin
144.                            nextWatchDogTimer = 1'b0;
145.                            if (requestA || requestB || requestC) nextState = ready;
146.                    end
147.                    ready:
148.                    begin
149.                            if (requestA) nextState = stateA;
150.                            else if (requestB) nextState = stateB;
151.                            else if (requestC) nextState = stateC;
152.                            else nextState = idle;
153.                    end
154.                    stateA:
155.                    begin
156.                            // vx activate(dataA);
157.                            nextState= stateA;
158.                            // if request has been disabled or the max access time has
159.                            //reached change state.
160.                            if ((requestA == 1'b0) || (watchDogTimer == maxAccessTime)) begin
161.                                    nextWatchDogTimer = 1 'b0;
162.                                    if (requestB) nextState = stateB;
163.                                    else if (requestC) nextState = stateC;
164.                                    else nextState = idle;
165.                            end
166.                    end
167.                    stateB:
168.                    begin
169.                            // vx activate(dataB);
170.                            nextState= stateB;
171.                            if ((requestB == 1'b0) || (watchDogTimer == maxAccessTime)) begin
172.                                    nextWatchDogTimer = 1'b0;
173.                                    if (requestC) nextState= stateC;
174.                                    else if (requestA) nextState= stateA;
175.                                    else nextState= idle;
176.                            end
177.                    end
178.                    stateC:
179.                    begin
180.                            // vx activate(dataC);
181.                            nextState= stateC;
182.                            if ((requestC === 1'b0) || (watchDogTimer == maxAccessTime)) begin
183.                                    nextWatchDogTimer = 1'b0;
184.                                    if (requestA) nextState = stateA;
185.                                    else if (requestB) nextState= stateB;
186.                                    else nextState^ idle;
187.                            end
188.                    end
189.                    endcase//case(state)
190.            end
191.    end//always
```

*FIG. 9D*

```
192.        //state transition
193.        always @(posedge clk)
194.        begin
195.                state <= nextState;
196.                watchDogTimer <= nextWatchDogTimer;
197.        end
198.        //outputs
199.        assign grantA = (nextState == stateA);
200.        assign grantB = (nextState == stateB);
201.        assign grantC = (nextState == stateC);
202.        assign writeData = (grantA ? dataA : 'DATA_WIDTH'bz);
203.        assign writeData = (grantB ? dataB : 'DATA_WIDTH'bz);
204.        assign writeData = (grantC ? dataC : 'DATA_WIDTH'bz);
205.        assign maxAccessTime = •DEFAULT_MAX_ACCESS_TIME;
206.        // vx always onetrue("grant", grantA, grantB, grantC);
207.    endmodule // RoundRobinArbiter
```

FIG. 9E

```
1    ====================================
2.   Validation Results for Module "main"
3    ====================================
4.
5    =========================
6.   Functional Checks Summary
7    =========================
8.   Failed checks (FAILED)                                  = 5
9.   Bounded failed checks (BOUNDED_FAIL)                    = 0
10.  Inconclusive checks (INCONCLUSIVE)                      = 3
11.  Secondary failed checks (SECONDARY)                     = 0
12.  Interface checks (INTERFACE)                            = 12
13.  Skipped checks (UNPROCESSED/DISABLED/DEFERRED)          = 0
14.  Bounded passed checks (BOUNDED_PASS)                    = 0
15.  Passed checks (PASSED/USER PASSED/CONDITIONAL)          = 144
16.  _____
17.  Total checks                                            =164
18.
19   =========================
20.  RTL Characteristics Summary
21.  =========================
22.  Number of inferred flops        = 10
23.  Number of inferred latches      = 0
24.  Number of static X sources      = 0
25.  Number of non-resettable flops  = 0
26.
27   ==================================
28.  Summary of failed checks by type:
29.  ==================================
30.  [CA] =0   (out of 39)
31.  [BE] = 1  (out of 40)
32.  [AX] = 1  (out of 15)
33.  [CME]=0   (out of 10)
34.  [CV] =0   (out of 29)
35.  [AC] =0   (out of 7)
36.  [AAO]=0   (out of 6)
37.  [AID]=0   (out of 9)
38.  [LVD] = 3 (out of 9)
```

*FIG. 13A*

```
39.
40.    Block enable [BE] : 1 failed check
41.    ─────────────────────────────
42.    FAILED     BE   : arbiter.nextState_bit0_AX_6
43.                    : Enable condition for block with assignment "arbiter.nextState_bit0_AX_6" is always off
44.                    : Block with assignment "arbiter.nextState_bit0_AX_6" is defined on line 191 of "rr3.v"
45.
46.    Assignment execution [AX] : 1 failed check
47.    ─────────────────────────────
48.    FAILED     AX   : arbiter.nextWatehDogTimer_bit0_AX_1
49.                    : Assignment "arbiter.nextWatchDogTimer_bit0_AX_1" only has a constant 1'b1 value
50.                    : Assignment "arbiter. nextWatchDogTimer_bit0_AX_1" is defined on line 179 of "rr3.v"
51.
52.    Loss of valid data [LVD]  : 3 failed checks
53.    ─────────────────────────────
54.    FAILED     LVD  : dataA[0]
55.                    : Loss of valid data has been detected on wire "dataA[0]"
56.                    : Wire "dataA[0]" is defined on line 40 of "rr3.v"
57.                    : VCD file is "roundRobin3/main/trace221 .vcd"
58.    FAILED     LVD  :dataB[0]
59.                    : Loss of valid data has been detected on wire "dataB[0]"
60.                    : Wire "dataB[0]" is defined on line 41 of "rr3.v"
61.                    : VCD file is "roundRobin3/main/trace223.vcd"
62.    FAILED     LVD  :dataC[0]
63.                    : Loss of valid data has been detected on wire "dataC[0]"
64.                    : Wire "dataC[0]" is defined on line 42 of "rr3.v"
65.                    : VCD file is "roundRobin3/main/trace225.vcd"
```

*FIG. 13B*

```
66.     ==========================================
67.     Summary of bounded failed checks by type :
68.     ==========================================
69.     [CA] =0  (out of 39)
70.     [BE] =0  (out of 40)
71.     [AX] =0  (out of 15)
72.     [CME]=0  (out of 10)
73.     [CV] =0  (out of 29)
74.     [AC] =0  (out of 7)
75.     [AAO] = 0  (out of 6)
76.     [AID]=0  (out of 9)
77.     [LVD] = 0  (out of 9)
78.
79.     ==========================================
80.     Summary of inconclusive checks by type :
81.     ==========================================
82.     [CA] =0  (out of 39)
83.     [BE] =0  (out of 40)
84.     [AX] =0  (out of 15)
85.     [CME]=0  (out of 10)
86.     [CV] =0  (out of 29)
87.     [AC] =0  (out of 7)
88.     [AAO]=0  (out of 6)
89.     [AID] = 0  (out of 9)
90.     [LVD] =3  (out of 9)
91.
92.     Loss of valid data [LVD] 3 inconclusive checks
93.     ─────────────────────────────────
94.     INCONCLUSIVE  LVD    :busInterfaceA.dataOut[0]
95.                          : Valid data loss check on wire "busInterfaceA.dataOut[0]" did not complete
96.                          : Wire "busInterfaceA.dataOut[0]" is defined on line 80 of "rr3.v"
97.     INCONCLUSIVE  LVD    :busInterfaceB.dataOut[0]
98.                          : Valid data loss check on wire "busInterfaceB.dataOut[0]" did not complete
99.                          : Wire "busInterfaceB.dataOut[0]" is defined on line 80 of "rr3.v"
100.    INCONCLUSIVE  LVD    :busInterfaceC.dataOut[0]
101.                         : Valid data loss check on wire "busInterfaceC.dataOut[0]" did not complete
102.                         : Wire "busInterfaceC.dataOut[0]" is defined on line 80 of "rr3.v"
103.
104.    ==========================================
105.    Summary of secondary failed checks by type :
106.    ==========================================
107.    [CA] =0  (out of 39)
108.    [BE] =0  (out of 40)
109.    [AX] =0  (out of 15)
110.    [CME]=0  (out of 10)
111.    [CV] =0  (out of 29)
112.    [AC] =0  (out of 7)
113.    [AAO]=0  (out of 6)
114.    [AID]=0  (out of 9)
115.    [LVD]=0  (out of 9)
```

*FIG. 13C*

```
116.  =======================================
117.  Summary of interface checks by type :
118.  =======================================
119.  [CA] =0  (out of 39)
120.  [BE] =0  (out of 40)
121.  [AX] =0  (out of 15)
122.  [CME]=0  (out of 10)
123.  [CV] =0  (out of 29)
124.  [AC] =6  (out of 7)
125.  [AAO]=0  (out of 6)
126.  [AID] =3  (out of 9)
127.  [LVD]=3  (out of 9)
128.
129.  Assertion correctness [AC] : 6 interface checks
130.  ────────────────────────────────────────
131.  INTERFACE    AC    :busInterfaceA.envl
132.                     : Correctness check on assertion "busInterfaceA.envl" is at the interface
133.                     : Assertion "busInterfaceA.envl" is defined on line 121 of "rr3.v"
134.  INTERFACE    AC    :busInterfaceA.env2
135.                     : Correctness check on assertion "busInterfaceA.env2" is at the interface
136.                     : Assertion "busInterfaceA.env2" is defined on line 127 of "rr3.v"
137.                     : Check is used by conditional checks :
138.  AID                : arbiter.dataA[0]
139.  INTERFACE    AC    :busInterfaceB.envl
140.                     : Correctness check on assertion "busInterfaceB.envl" is at the interface
141.                     : Assertion "busInterfaceB.envl" is defined on line 121 of "rr3.v"
142.  INTERFACE    AC    :busInterfaceB.env2
143.                     : Correctness check on assertion "busInterfaceB.env2" is at the interface
144.                     : Assertion "busInterfaceB.env2" is defined on line 127 of "rr3.v"
145.                     : Check is used by conditional checks :
146.  AID                : arbiter.dataB[0]
147.  INTERFACE    AC    :busInterfaceC.envl
148.                     : Correctness check on assertion "busInterfaceC.envl" is at the interface
149.                     : Assertion "busInterfaceC.envl" is defined on line 121 of "rr3.v"
150.  INTERFACE    AC    :busInterfaceC.env2
151.                     : Correctness check on assertion "busInterfaceC.env2" is at the interface
152.                     : Assertion "busInterfaceC.env2" is defined on line 127 of "rr3.v"
153.                     : Check is used by conditional checks :
154.  AID                : arbiter.dataC[0]
155.
156.  Access of invalid data [AID] : 3 interface checks
157.  ────────────────────────────────────────
158.  INTERFACE    AID   :dataA[0]
159.                     : Wire "dataA[0]" has accessed invalid data from the interface
160.                     : Wire "dataA[0]" is defined on line 40 of "rr3.v"
161.  INTERFACE    AID   :dataB[0]
162.                     : Wire "dataB[0]" has accessed invalid data from the interface
163.                     : Wire "dataB[0]" is defined on line 41 of "rr3.v"
164.  INTERFACE    AID   :dataC[0]
165.                     : Wire "dataC[0]" has accessed invalid data from the interface
166.                     : Wire "dataC[0]" is defined on line 42 of "rr3.v"
```

*FIG. 13D*

```
167.
168.   Loss of valid data [LVD] 3 interface checks
169.   ─────────────────────────────────────────
170.   INTERFACE   LVD        :arbiter.dataA[0]
171.                          : Wire "arbiter.dataA[0]" has loss of valid data at the interface
172.                          : Wire "arbiter.dataA[0]" is defined on line 141 of "rr3.v"
173.   INTERFACE   LVD        :arbiter.dataB[0]
174.                          : Wire "arbiter.dataB[0]" has loss of valid data at the interface
175.                          : Wire "arbiter.dataB[0]" is defined on line 142 of "rr3.v"
176.   INTERFACE   LVD        :arbiter.dataC[0]
177.                          : Wire "arbiter.dataC[0]" has loss of valid data at the interface
178.                          : Wire "arbiter.dataC[0]" is defined on line 143 of "rr3.v"
179.
180.   ==========================================
181.   Summary of unprocessed checks by type :
182.   ==========================================
183.   [CA] =0   (out of 39)
184.   [BE] =0   (out of 40)
185.   [AX] =0   (out of 15)
186.   [CME]=0   (out of 10)
187.   [CV] =0   (out of 29)
188.   [AC] =0   (out of 7)
189.   [AAO]=0   (out of 6)
190.   [AID]=0   (out of 9)
191.   [LVD]=0   (out of 9)
192.
193.   [...]
194.
195.   ====================================
196.   Summary of passed checks by type :
197.   ====================================
198.   [CA] =39  (out of 39)
199.   [BE] =39  (out of 40)
200.   [AX] = 14 (out of 15)
201.   [CME]= 10 (out of 10)
202.   [CV] =29  (out of 29)
203.   [AC] = 1  (out of 7)
204.   [AAO]=6   (out of 6)
205.   [AID] =6  (out of 9)
206.   [LVD] = 0 (out of 9)
207.
208.   [...]
209.
210.   =====================
211.   List of inferred flops
212.   =====================
213.   busInterfaceA.state[0]
214.   busInterfaceA.state[1]
215.   busInterfaceB.state[0]
216.   busInterfaceB.state[1]
217.   busInterfaceC.state[0]
218.   busInterfaceC.state[1]
219.   arbiter.state[0]
220.   arbiter.state[1]
221.   arbiter.state[2]
222.   arbiter.watchDogTimer[0]
```

*FIG. 13E*

INTENT-DRIVEN FUNCTIONAL VERIFICATION OF DIGITAL DESIGNS

COPYRIGHT NOTICE

Contained herein is material that is subjected to copyright protection. The copyright owner has no objection to the facsimile reproduction of the patent disclosure by any person as it appears in the patent and Trademark Office patents files or records, but otherwise reserves all rights to the copyright whatsoever.

BACKGROUND OF THE INVENTION

1. Field of the Invention

The invention relates generally to the field of design verification. More particularly, the invention relates to a new approach for functional verification of digital designs.

2. Description of the Related Art

The objective of design verification is to ensure that errors are absent from a design. Deep sub-micron integrated circuit (IC) manufacturing technology is enabling IC designers to put millions of transistors on a single IC. Following Moore's law, design complexity is doubling every 12–18 months, which causes design verification complexity to increase at an exponential rate. In addition, competitive pressures are putting increased demands on reducing time to market. The combination of these forces has caused an ever worsening "verification crisis".

Today's design flow starts with a specification for the design. The designer then implements the design in a language model, typically Hardware Description Language (HDL). This model is typically verified to discover incorrect input/output (I/O) behavior via a stimulus in expected results out paradigm at the top level of the design.

By far the most popular method of functional verification today, simulation-based functional verification, is widely used within the digital design industry as a method for finding defects within designs. A very wide variety of products are available in the market to support simulation-based verification methodologies. However, a fundamental problem with conventional simulation-based verification approaches is that they are vector and testbench limited.

Simulation-based verification is driven by a testbench that explicitly generates the vectors to achieve stimulus coverage and also implements the checking mechanism. Testbenches create a fundamental bottleneck in simulation-based functional verification. In order to verify a design hierarchy level, a testbench must be generated for it. This creates verification overhead for coding and debugging the testbench. Hence, a significant amount of expensive design and verification engineering resources are needed to produce results in a cumbersome and slow process.

Several methods have been attempted by Electronic Design Automation (EDA) companies today in order to address the shortcomings of simulation. However, none of these attempts address this fundamental limitation of the process. For example, simulation vendors have tried to meet the simulation throughput challenge by increasing the performance of hardware and software simulators thereby allowing designers to process a greater number of vectors in the same amount of simulation time. While this does increase stimulus coverage, the results are incremental. The technology is not keeping pace with the required growth rate and the verification processes are lagging in achieving the required stimulus coverage.

Formal verification is another class of tools that has entered the functional verification arena. These tools rely on mathematical analysis rather than simulation of the design. The strong selling point of formal verification is the fact that the results hold true for all possible input combinations to the design. However, in practice this high level of stimulus coverage has come at the cost of both error coverage and particularly usability. While some formal techniques are available, they are not widely used because they typically require the designer to know the details of how the tool works in order to operate it. Formal verification tools generally fall into two classes: (1) equivalence checking, and (2) model checking.

Equivalence checking is a form of formal verification that provides designers with the ability to perform RTL-to-gate and gate-to-gate comparisons of a design to determine if they are functionally equivalent. Importantly, however, equivalence checking is not a method of functional verification. Rather, equivalence checking merely provides an alternate solution for comparing a design representation to an original golden reference. It does not verify the functionality of the original golden reference for the design. Consequently, the original golden reference must be functionally verified using other methods.

Model checking is a functional verification technology that requires designers to formulate properties about the design's expected behavior. Each property is then checked against an exhaustive set of functional behaviors in the design. The limitation of this approach is that the designer is responsible for exactly specifying the set of properties to be verified. The property specification languages are new and obscure. Usually the technology runs into capacity problems and the designer has to engage with the tools to solve the problems. There are severe limits on the size of the design and the scope of problems that can be analyzed. For example, the designer does not know which properties are necessary for complete analysis of the design. Further, specifying a large number of properties does not correlate well with better error coverage. Consequently, model checking has proven to be very difficult to use and has not provided much value in the verification process.

In view of the foregoing it would be desirable to create a verification methodology to create high quality designs without the need for simulation testbench and to increase the productiveness of design engineers by minimizing the tool setup effort and report processing effort. In particular, it would be advantageous to abstract the internal details of the tools from the user to make these tools more accessible to designers. For example, it would be advantageous to allow a verification methodology to be employed while allowing the designer to think about characteristics of the design. In this manner, the designer can think in terms of time progression of data at various design elements (entities) rather than the implementation of the verification tool. Additionally, rather than requiring the designer to write properties in a complex and arcane language, it would be advantageous to automatically formulate a list of verification checks that, if satisfied, would guarantee the absence of errors in a design with a high level of confidence. Finally, it would be advantageous to maintain and utilize relationships among the list of automatically generated verification checks to facilitate error reporting and to prune the error space for more efficient run-time processing.

BRIEF SUMMARY OF THE INVENTION

A method and apparatus are described that facilitate analysis of the intended flow of logical signals between key points in a design. According to one aspect of the present invention, hardware design defects can be detected using a novel Intent-Driven Verification process. First, a representation of a hardware design and information regarding the intended flow of logical signals among variables in the representation are received. Then, the existence of potential errors in the hardware design may be inferred based upon the information regarding the intended flow of logical signals by (1) translating the information regarding the intended flow of logical signals into a comprehensive set of checks that must hold true in order for the hardware design to operate in accordance with the intended flow of logical signals, and (2) determining if any of the checks can be violated during operation of circuitry represented by the hardware design. Advantageously, in this manner, the designer is not required to manually code individual monitors for each property he/she would like to verify. Rather, verification cycle time and resource requirements are reduced by allowing the designer to simply annotate a language representation of the hardware design under test with information regarding the desired/expected interaction between components of the design and/or the designer's expectations for acceptable functional behavior (in terms of the expected state of variables at various points in the control flow structure of a finite state machine associated with the hardware design representation, for example) and the generation of a comprehensive set of checks for identifying the intent gap is automatically performed.

Other features of the present invention will be apparent from the accompanying drawings and from the detailed description that follows.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which:

FIGS. 9A–9E represent an exemplary RTL source code representation of the design example of FIG. 6B.

FIGS. 13A–13E illustrate an exemplary text report file for the annotated RTL of FIGS. 9A–9E according to one embodiment of the present invention.

DETAILED DESCRIPTION OF THE INVENTION

Figure 1:
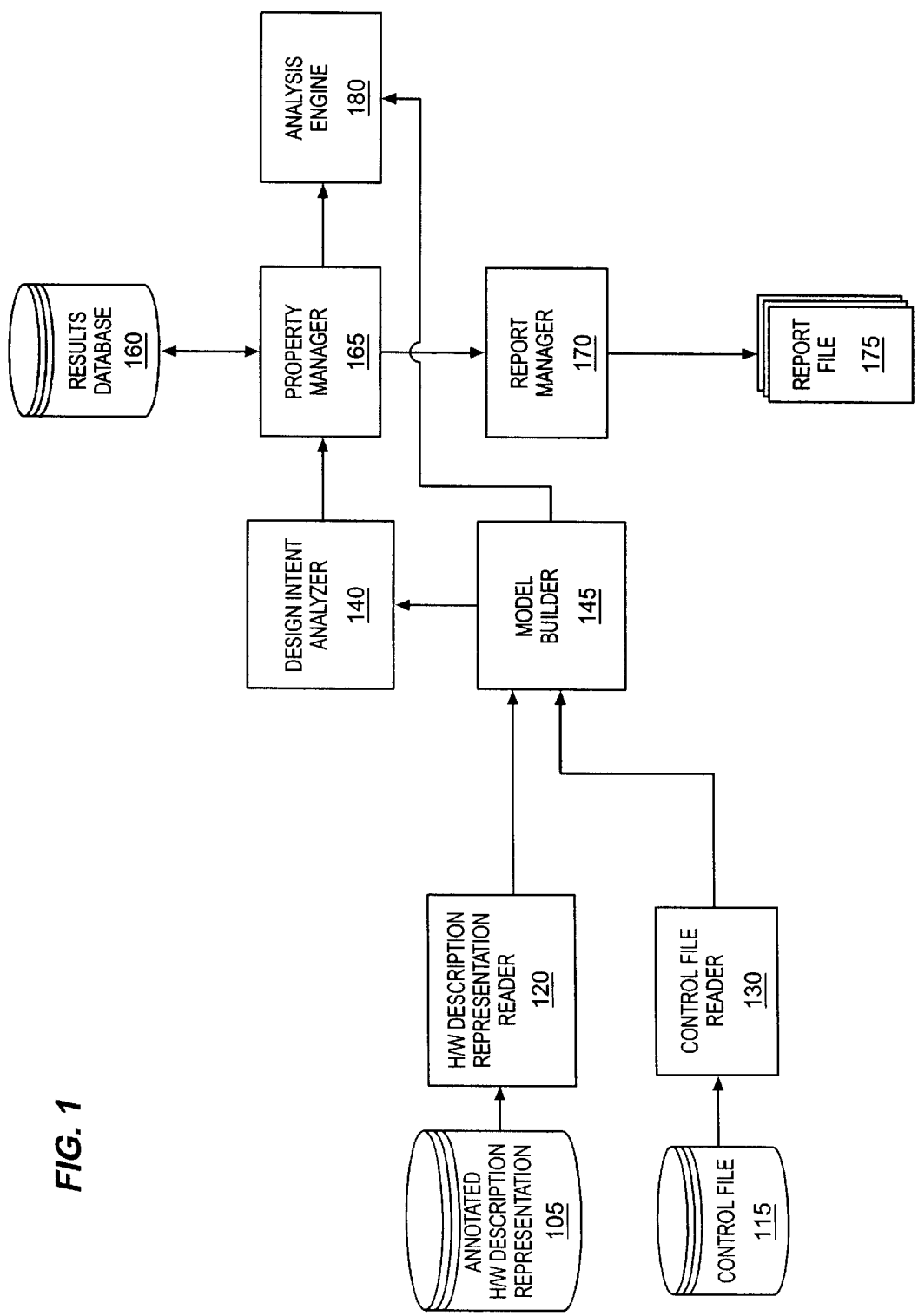
FIG. 1 is a block diagram illustrating an exemplary architecture of an Intent-Driven Verification system according to one embodiment of the present invention.

A method and apparatus are described that facilitate analysis of the intended flow of logical signals between key points in a design. Embodiments of the present invention seek to solve or at least alleviate the above-referenced problems of conventional verification approaches by employing a revolutionary approach for functional verification. Importantly, this approach enables verification of design intent prior to simulation and synthesis. Identifying and eliminating design defects early in the design cycle eliminates costly down-stream design iterations resulting in dramatically shorter design verification cycles.

Broadly stated, embodiments of the present invention allow errors in a hardware design to be discovered by checking a representation of the hardware design against design intent. In one embodiment, a comprehensive set of design verification checks including behavioral integrity checks and temporal integrity checks are automatically generated based upon a language representation of a hardware design and information regarding the design intent, e.g., the intended flow of logical signals among a plurality of variables in the language representation of the hardware design. The design intent may be communicated to a hardware design verification tool, for example, by way of inline annotations embedded within the hardware design description. Advantageously, in this manner, the design verification process is streamlined thereby allowing quality levels to be achieved faster and with reduced resource requirements.

According to one embodiment, a novel "verification entity," referred to as a Sentry™ verification entity, is provided that facilitates modeling and verification of what the designer intended to build (SENTRY is a trademark or registered trademark of Real Intent, Inc. of Santa Clara, Calif.). For example, feedback may be provided to the designer regarding differences between what has actually been created by a language representation of a hardware design, such as a Register Transfer Language (RTL) source code representation, and the design intent, e.g., the intended flow of logical signals in a the hardware design.

Briefly, Sentry verification entities may conceptually be thought of as objects, which are embedded in a design during the verification process. Sentry verification entities are not structural entities-they are not included in the final hardware. Rather, Sentry verification entities are special purpose objects for support of verification. Sentry verification entities provide a mechanism for expressing design intent. Expressed design intent (i.e., design intent that is explicitly stated by the designer) and implied design intent (i.e., expected behaviors that should occur within standard design practices although not explicitly stated by the designer) are checked against what the design actually accomplishes. As will be described further below, in one embodiment, Sentry verification entities are embedded within a model of the design under test to represent sentinel variables in the design through which logical signals in the design pass. For example, a Sentry verification entity may be used to explicitly associate state information with a sentinel variable independent of the value of the sentinel variable. The state information may indicate whether or not the sentinel variable is active or inactive at various points in the control flow structure of a finite state machine associated with the hardware design representation. Consequently, the integrity of the data flow can be verified by confirming checks that are expressed as a function of the states associated with one or more sentinel variables.

According to another embodiment, a comprehensive set of design verification checks may be formulated by applying predetermined properties to an annotated hardware design representation. The application of predetermined properties, such as conflicting assignments (CA), block enable (BE), assignment execution (AX), constant value memory element (CME), constant value variable (CV), Sentry activate always off (AAO), loss of valid data (LVD), assertion correctness (AC), and access of invalid data (AID), to signal propagation among all the sentinel variables results in an exhaustive list of checks that confirm whether or not the predetermined properties hold true for the intended flow of logical signals. Advantageously, in this manner, a designer gets the benefits of a comprehensive Intent-Driven Verifications™ (IDV™) methodology by simply identifying sentinel variables and providing information regarding intended temporal behaviors and/or relationships (INTENT-DRIVEN VERIFICATION and IDV are trademarks or registered trademarks of Real Intent, Inc. of Santa Clara, Calif.)

According to yet another embodiment, an ordered representation of the comprehensive set of design verification checks can be created to allow conclusions to be drawn about the hardware design. For example, dependency relationships among the comprehensive set of design verification checks may be determined. A check is dependent upon a set of other checks if it is impossible to violate the first without violating at least one or more checks from the set. After the dependency relationships have been determined, this linking information may be used to facilitate error reporting or to streamline check processing. Notably, reporting of multiple intent violations due to a common design defect may be avoided thereby containing redundant failures commonly produced by prior art simulators. Additionally, if there is no way to violate the current check being verified without also violating one or more other previously processed checks, there is no point in reporting the violation of the current check since this would not communicate any new information to the user. Finally, assuming it has already been determined that a first check cannot be violated, during the processing of a subsequent check, if the current search path violates the first check, then the current search path can be abandoned since there is no solution along the current search path. In this manner, checks may be more efficiently processed and the user is not inundated with redundant, cumulative information.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor programmed with the instructions to perform the steps. Alternatively, the steps may be performed by a combination of hardware and software.

The present invention may be provided as a computer program product that may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

For convenience, embodiments of the present invention will be described with reference to Verilog and VHDL. However, the present invention is not limited to any particular representation of a hardware design. For example, the language representation of a hardware design may be in the C programming language, C++, derivatives of C and/or C++, or other high-level languages. In addition, while embodiments of the present invention are described with reference to functional verification of hardware designs, aspects of the present invention are equally applicable to other types of design activities as well, such as hardware synthesis, design optimization, design simulation and performance analysis. Furthermore, while embodiments of the present invention are described with reference to the provision of augmented design information by way of hardware description language (HDL) annotations, it is contemplated that the augmented design information could reside in a file separate from the file containing the HDL. Alternatively, a new HDL could be developed having semantics capable of capturing the augmented design information.

Terminology

Before describing an illustrative design verification environment in which various embodiments of the present invention may be implemented, brief definitions of terms used throughout this application are given below.

A "design" is defined as a description of a collection of objects, such as modules, blocks, wires, registers, etc. that represent a logic circuit.

A design may be expressed in the form of a language. For example, a hardware description language (HDL), such as Verilog or VHDL can be used to describe the behavior of hardware as well as its implementation.

As used herein an "annotation" refers to text embedded in a language construct, such as a comment statement or remark. Most programming languages have a syntax for creating comments thereby allowing tools designed to read and/or process the programming language to read and ignore the comments.

"Simulation" is generally the process of evaluating design behavior for a set of input conditions to draw approximate conclusions about the behavior of many different attributes of the design.

"Formal analysis" generally refers to the process of analyzing a design for all possible input conditions to derive definite conclusions about the behavior of an attribute with respect to the design.

"Functional verification" generally refers to the process of applying stimuli to a design under test with appropriate checking mechanisms to either detect a defect in the design or to establish that the functionality performs as expected. Typically, the three key components of a functional verification process are the applied stimulus, the checking mechanism, and the user's ability to both run the process and debug the results. As will be described later, the effectiveness of a functional verification process may be measured in terms of the following three metrics: (1) error coverage, (2) stimulus coverage, and (3) usability.

The term "design intent" generally refers to what the designer intends in terms of the interaction between components of the design and the designer's expectations regarding acceptable functional behavior. For example, the designer may intend a particular flow of logical signals among the variables of an RTL design description (the intended flow). Traditionally, design intent has referred to input constraints, internal constraints, and/or cause and effect modeling. In contrast, as used herein the term "design intent" includes "implied design intent" and additional forms of "expressed design intent." Expressed design intent generally refers to design intent explicitly conveyed by a designer by way of intent modeling semantics in a control file or embedded within annotations of RTL source code (the hardware design representation), for example. Examples of expressed design intent regarding the intended flow of logical signals may include the intended temporal behaviors (e.g., the ACK signal must go high within 4 cycles of the REQ signal) and the intended data flow relationships (e.g., the data being loaded from the input port is the data intended for transfer by the driver of the input port). Implied design intent generally refers to design intent that is inferred from the design description including expected behaviors that should occur within standard design practices.

A "Sentry verification entity" or "verification entity" generally refers to an object that may be embedded within a hardware design to facilitate the modeling of design intent. As described further below, Sentry verification entities provide a mechanism by which state information can be associated with variables in a representation of a hardware design. According to various embodiments of the present invention, Sentry verification entities may be used to verify a design by allowing design intent (both expressed and implied) to be checked against what the design actually accomplishes.

A "property" is a condition or statement, typically expressed in terms of a relationship among a group of one or more signals in a hardware design, that must hold for the hardware design to function as intended. According to one embodiment, violations are reported at the property-level rather than at the more detailed level of design verification checks.

The term "design verification check" or simply "check" generally refers to a mechanism for verifying a property. Properties may be composed of one or more checks, which are the atomic units that are verified. That is, properties may be broken down into one or more checks. Since properties and checks are sometimes equivalent (i.e., when a property comprises a single design verification check), these terms may at times be used interchangeably. Examples of checks include, but are not limited to: monitors, Boolean conditions, sensitized path conditions, and the like. According to one embodiment, a comprehensive set of checks may be automatically formulated based upon a representation of the hardware design and information regarding the intended flow of logical signals among a plurality of variables in the representation.

Check A is said to be "dependent" upon checks B, C, and D if it is impossible to violate check A without violating at least one of checks B, C, and D. If check A is dependent upon check B, C and D, then a "dependency relationship" exists between check A and checks B, C, and D.

Characteristics of Effective Functional Verification

As mentioned earlier, the effectiveness of a functional verification process may be measured in terms of error coverage, stimulus coverage, and usability. Error coverage refers to the ability of the verification methodology to identify a broad range of potential design defects. A verification process should be effective in identifying all potential failures in a hardware design. This is achieved by creating a checking mechanism. In traditional practice, the checking mechanism is created by comparing the hardware design representation, e.g., RTL source code, to an independently created design model. This independent model is used to predict the response of the design for comparison. Given that the purpose of the verification process is to assure design quality, it is important to build a very comprehensive checking mechanism.

Stimulus coverage refers to the ability of the verification methodology's ability to achieve broad coverage of the input domain. Preferably, the verification process should examine all possible combinations of input sequences for the design under test. High stimulus coverage is critical to verification, particularly with designs containing large numbers of states. Yet, all existing technologies fall short here. The ideal verification process should achieve exhaustive stimulus coverage for any design.

Usability refers to the overall ease and effectiveness of user interaction with the verification tool. The verification process should be simple and effective to use. To accomplish this, setup costs for running the process should be minimized, and the reported information should be well organized to allow easy debugging. The process should fit well into existing design methodologies and should require a minimum amount of training in order to be used effectively. Usability should be given high priority when developing any functional verification system and should not be an afterthought that is secondary to the underlying technology.

Intent-Driven Verification Overview

Intent-Driven Verification (IDV) is a revolutionary approach for functional verification of hardware designs. IDV ranks high on all three of the above-described metrics and successfully integrates the technologies required for an effective functional verification system together into a complete package. Briefly, IDV identifies the "intent gap" between what a designer intends to build (design intent) and what has actually been created within the language representation of the hardware design (design implementation), such as RTL source code. Advantageously, by simply augmenting the RTL source code or associated control file with information indicative of the designer's intent, a comprehensive set of checks can be automatically formulated and verified. This provides a novel and effective way to identify design problems early in the development process.

Additionally, IDV is scalable, provides fast isolation of the source of defects, and significantly reduces the overall verification effort, thus enabling IC design projects to dramatically reduce their time to market.

An Exemplary Intent-Driven Verification System

FIG. 1 is a block diagram illustrating an exemplary architecture of an Intent-Driven Verification (IDV) system according to one embodiment of the present invention. According to the embodiment depicted, the IDV system 100 includes an annotated hardware design representation reader 120. The annotated hardware design representation reader 120 may be a conventional RTL reader with the additional ability to recognize and process augmented design information. Alternatively, the annotated hardware design representation reader 120 may be a conventional C or C++parser capable of processing the augmented design information. In one embodiment, the augmented design information comprises annotations embedded within the hardware design representation 105, such as an annotated RTL source code file 105 containing special verification semantics (directives). Exemplary directives and their syntax are described further below. In alternative embodiments, the augmented design information may be included in a control file associated with the hardware design representation 105, such as control file 115.

The IDV system 100 also includes a control file reader 130. The control file reader 130 may be a conventional control file reader. Alternatively, in the case that the augmented design information (e.g., information regarding design intent, such as the intended flow of logical signal among variables in the hardware design representation) is to be provided by way of control file 115, then the control file reader 130 additionally includes parsing functionality enabling the control file reader 130 to recognize and process the augmented design information.

According to the architecture depicted, the IDV system 100 also includes a model builder 145, a design intent analyzer 140, a property manager 165, an analysis engine 180, and a report manager 170. The model builder 145 receives output of the hardware design representation reader 120, the control file reader 130, and a cell library (not shown) and builds an internal representation of the hardware design, a model. Additionally, based upon the designer's expressed design intent and/or implied intent, the model builder embeds special verification entities into the model for the purpose of identifying the intent gap between what the designer intended to build (design intent) and what has actually been created within the source code (design implementation). These special embedded objects are referred to as Sentry verification entities. Details regarding the use, functionality, and implementation of Sentry verification entities are presented below.

The design intent analyzer 140 automatically produces a comprehensive set of design verification checks, such as behavioral integrity checks and temporal integrity checks, based upon a predetermined set of properties and the Sentry verification entities. For example, for each Sentry verification entity in the model, the design intent analyzer 140 may automatically create checks to verify that there is no access of invalid data by the Sentry verification entity and that no active data from the Sentry verification entity is lost. Other properties and verification of these properties, in terms of checks and Sentry verification entities, are discussed below. Consequently, by merely associating the Sentry attribute with a variable in an RTL representation of the hardware design and providing minimal additional information regarding the desired/expected interaction between components of the design and regarding expectations for acceptable functional behavior, the design intent analyzer 140 enables verification while the design is being developed and facilitates detection of design defects at the RTL-level. Advantageously, in this manner, the designer is not required to manually code individual monitors for each property he/she would like to verify. Rather, verification cycle time and resource requirements are reduces by allowing the designer to simply associate the Sentry attribute with certain important variables, sentinel variables (e.g., by "declaring" the sentinel variables as Sentry verification entities), provide minimal additional information regarding the desired/ expected interaction between components of the design (such as an indication regarding the expected state of the sentinel variables at various points in the control flow structure of a finite state machine associated with the hardware design representation), and the generation of a complete set of checks involving the sentinel variables is automatically performed. Importantly, the use of Sentry verification entities to enable automatic formulation of a comprehensive set of design verification checks not only dramatically reduces verification effort and time but also significantly increases design robustness.

The property manager 165 maintains information regarding relationships among the checks generated by the design intent analyzer and additionally maintains information regarding relationships among properties and whether the properties are satisfied violated, or whether the results are indeterminate or conditional upon one or more other properties. According to one embodiment, the property manger 165 and analysis engine 180 cooperate to determine dependency relationships among the comprehensive set of design verification checks. As described further below, the dependency relationships (or "linking" information) may be used to facilitate error reporting or used to streamline check processing.

The analysis engine 180 verifies the model produced by the model builder by testing for violations of the properties. Preferably, the analysis engine 180 employs an analysis-based technique, such as an integration of simulation and formal analysis methodologies, so as to maximize stimulus coverage for the design under test. However, in alternative embodiments, simulation, functional verification, or other well-known verification methodologies may be employed individually.

The report manager 170 provides feedback to the designer, in the form of a report file 175, for example, regarding potential design defects. It should be noted that a single error in the hardware design might lead to a violation of 25 to 30 or more different design verifications checks. There is no point in reporting every violation if the user has already been notified that an error exists. Therefore, according to one embodiment, an intent violation hierarchy may be maintained when reporting design defects. In this manner, redundancy of reported information is contained. Multiple intent violations due to a common defect are not reported. This minimizes the amount of data to be analyzed to detect defects.

High-Level Intent-Driven Verification Processing

Figure 2:
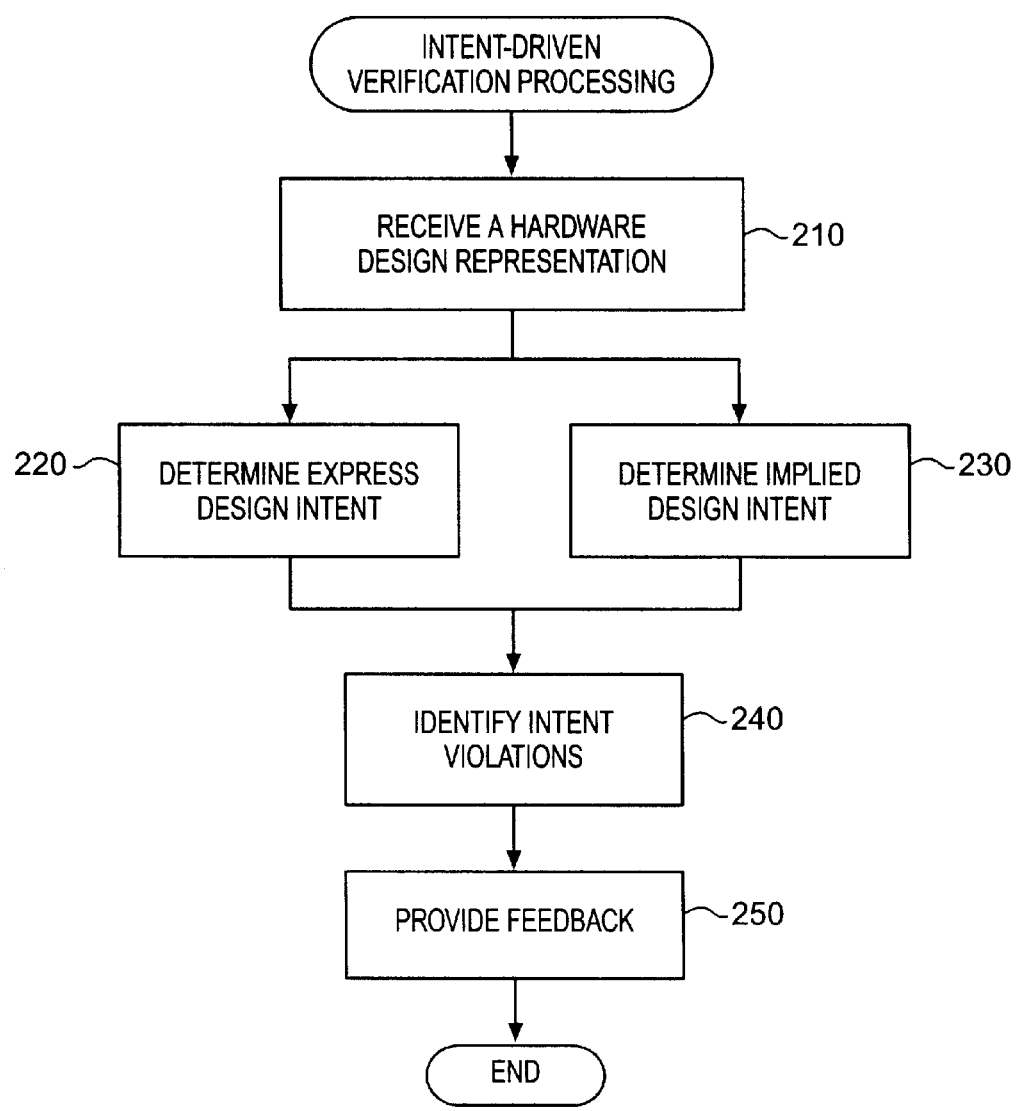
FIG. 2 is a high-level flow diagram illustrating an Intent-Driven Verification processing according to one embodiment of the present invention.

FIG. 2 is a high-level flow diagram illustrating Intent-Driven Verification processing according to one embodiment of the present invention. The Intent-Driven Verification process generally breaks down into three fundamental technologies, intent capture, intent gap detection, and intent violation reporting. A method for capturing the designer's intent for the design (intent capture) is represented by processing blocks 210–230, detection of areas within the design source code that differ from the original design intent (intent gap detection) comprises processing block 240, and identification and reporting of the space between the designer's intent and the design's implementation (intent violation reporting) is represented by processing block 250. Briefly, after a complete view of the overall design intent is captured, e.g., after the two forms of intent are integrated together by the design intent analyzer 140, the analysis engine 180 may begin identifying individual intent violations. When the analysis is complete, the report manager 170 provides feedback to the user in a well-organized manner. In one embodiment, the processing blocks described below may be performed under the control of a programmed processor, such as processor 302. However, in alternative embodiments, the processing blocks may be fully or partially implemented by any programmable or hardcoded logic, such as Field Programmable Gate Arrays (FPGAs), TTL logic, or Application Specific Integrated Circuits (ASICs), for example.

Intent-Driven Verification processing begins at processing block 210 where a language representation of a hardware design under test is received. The language representation may be RTL source code, such as Verilog or VHDL. Preferably, to take advantage of the control flow structure of the language representation, augmented design information is provided by inline annotations to the language representation of the hardware design, e.g., annotated RTL 105. However, in alternative embodiments, design intent may be provided in the control file 115.

In this example, at processing blocks 220 and 230, the design intent is captured in two basic forms: expressed and implied. Expressed design intent is design intent that is explicitly stated by the designer. The implementation of IDV described herein may use an elegant RTL-based method to express this intent in an annotated RTL source code file, such as annotated hardware description representation 105, and/or the control file 115. Regardless of their source, the expressed design intent is determined based upon the annotations. Importantly, the form of intent modeling provided herein is very intuitive and does not require the users to learn a new language. Additionally, this intent modeling captures the intent in a concise manner and thereby minimizes setup effort. Typically, the expressed intent defines the interaction between components of the design and/or the designer's expectations regarding acceptable functional behavior. Implied design intent may be inferred directly from the design description. Advantageously, implied intent capture infers numerous and complex design behaviors automatically without requiring a designer to explicitly state them. Typically, this consists of expected behaviors that should occur within standard design practices.

At processing block 240, the intent gap is identified based upon the design intent and the design implementation. In the example depicted, the two forms of design intent are integrated and used as input to processing block 240. In alternative embodiments, the intent gap may be determined for only a single form of design intent or one or more other combinations of subsets of expressed and implied design intent. At any rate, preferably, the intent gap is statically identified using functional verification techniques. The intent gap is the distance between a design's intent and the actual implementation. According to one embodiment, IDV detects the intent gap in terms of individual intent violations.

Intent violations are the result of defects within the design implementation. Importantly, because the intended behavior of the design is well understood, intent violations isolate design defects with high localization to their source.

At processing block 250, feedback is provided to the user. For example, one or more report files 175 may be created that provide information regarding the individual intent violations identified in processing block 240. Preferably, the redundancy of information is contained and the intent violation data is organized into a format that provides useful and highly accurate debugging information to a designer. Additionally, sequential debugging information may be provided along with detailed explanations of any identified intent violations. An exemplary report file format is illustrated in FIGS. 13A–13E.

An Exemplary Computer Architecture

Figure 3:
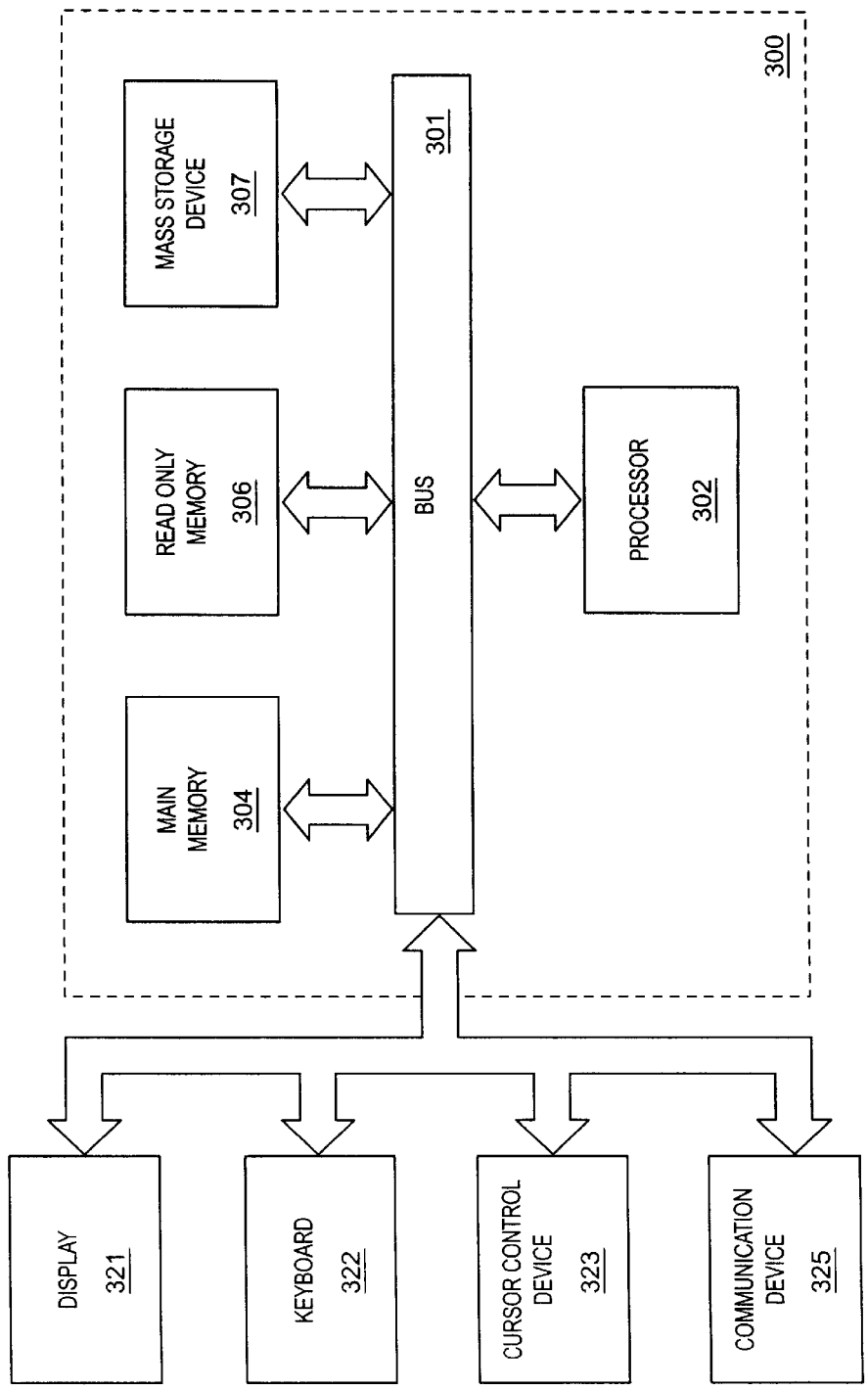
FIG. 3 is an example of a computer system upon which one embodiment of the present invention may be implemented.

Having briefly described an exemplary verification system in which various features of the present invention may be employed and high-level Intent-Driven Verification processing, an exemplary machine in the form of a computer system 300 representing an exemplary workstation, host, or server in which features of the present invention may be implemented will now be described with reference to FIG. 3. Computer system 300 comprises a bus or other communication means 301 for communicating information, and a processing means such as processor 302 coupled with bus 301 for processing information. Computer system 300 further comprises a random access memory (RAM) or other dynamic storage device 304 (referred to as main memory), coupled to bus 301 for storing information and instructions to be executed by processor 302. Main memory 304 also may be used for storing temporary variables or other intermediate information during execution of instructions by processor 302. Computer system 300 also comprises a read only memory (ROM) and/or other static storage device 306 coupled to bus 301 for storing static information and instructions for processor 302.

A data storage device 307 such as a magnetic disk or optical disc and its corresponding drive may also be coupled to computer system 300 for storing information and instructions. Computer system 300 can also be coupled via bus 301 to a display device 321, such as a cathode ray tube (CRT) or Liquid Crystal Display (LCD), for displaying information to an end user. For example, graphical and/or textual depictions/indications of design errors, and other data types and information may be presented to the end user on the display device 321. Typically, an alphanumeric input device 322, including alphanumeric and other keys, may be coupled to bus 301 for communicating information and/or command selections to processor 302. Another type of user input device is cursor control 323, such as a mouse, a trackball, or cursor direction keys for communicating direction information and command selections to processor 302 and for controlling cursor movement on display 321.

A communication device 325 is also coupled to bus 301. Depending upon the particular design environment implementation, the communication device 325 may include a modem, a network interface card, or other well-known interface devices, such as those used for coupling to Ethernet, token ring, or other types of physical attachment for purposes of providing a communication link to support a local or wide area network, for example. In any event, in this manner, the computer system 300 may be coupled to a number of clients and/or servers via a conventional network infrastructure, such as a company's Intranet and/or the Internet, for example.

Modeling Intended Flow of Logical Signals in a Hardware Design

Currently available verification methodologies lack suitable mechanisms to allow designers to adequately express their design intent. Rather, existing functional verification methodologies, such as model checking, generally require a designer to formulate properties about the design's expected behavior. Consequently, the designer is responsible for exactly specifying the set of properties to be verified. One problem with this approach, however, is that the designer may not know or even be capable of knowing which properties are necessary for a complete analysis of the design. Additionally, the property specification languages are new and obscure and typically require the designer to know the details of how the verification tool works in order to operate it.

Briefly, the intent modeling techniques described herein seek to raise the level of abstraction of the verification process to increase the productiveness of existing design environments/design verification tools. In particular, there is no need for the designer to have any knowledge regarding the internal details of tools employing these intent modeling techniques. Rather, the designer is free to focus on characteristics of the design under test. For example, according to one embodiment, incorporation of Sentry verification entities into a hardware design representation only requires simply annotations indicative of the expected state of variables at various points in the control flow structure of a finite state machine associated with the hardware design representation.

Figure 4A:
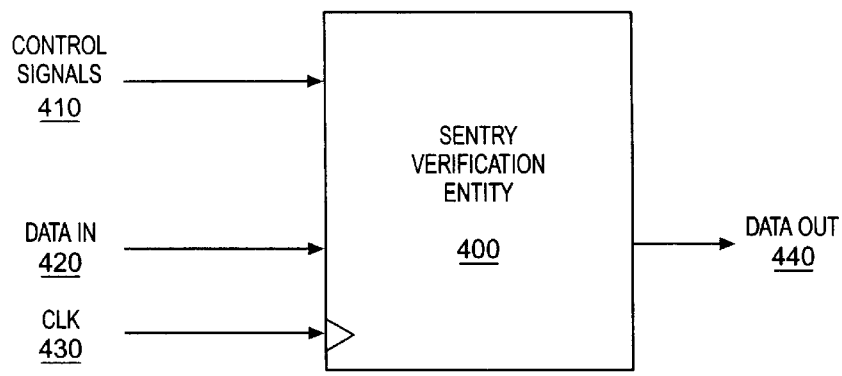
FIG. 4A is a high-level block diagram illustrating an exemplary Sentry verification entity according to one embodiment.

Referring now to FIG. 4A, a high-level block diagram illustrating an exemplary Sentry verification entity 400 will now be described. At this level, the Sentry verification entity 400 may be conceptually thought of as an object that enables explicit association of state information with variables of a language description of a hardware design. This association may be accomplished by "declaring" a variable, e.g., an interconnect in the hardware design representation through with logical signals pass, as a Sentry verification entity resulting in the creation of a sentinel variable. Data in 420 represents a flow of data signals into to the sentinel variable (e.g., an assignment of a data value to the sentinel variable); and data out 440 represents a flow of data signals out of the sentinel variable (e.g., an assignment of the current data value of the sentinel variable to another variable in the representation of the hardware design). As described further below, one or more control signals 410 may be employed to represent the intended flow of logical signals among sentinel variables by associating expected states with the sentinel variables at different points of the designs control flow. Additionally, design verification checks, expressed as a function of the expected states of the sentinel variables, may be automatically formulated thereby allowing the integrity of the data flow to be verified by confirming whether or not any positive checks (e.g., checks that indicate a design defect when there is a solution) are violated or whether or not a counterexample may be found for any negative checks (e.g., checks that indicate a design defect when there is not a solution).

Figure 4B:
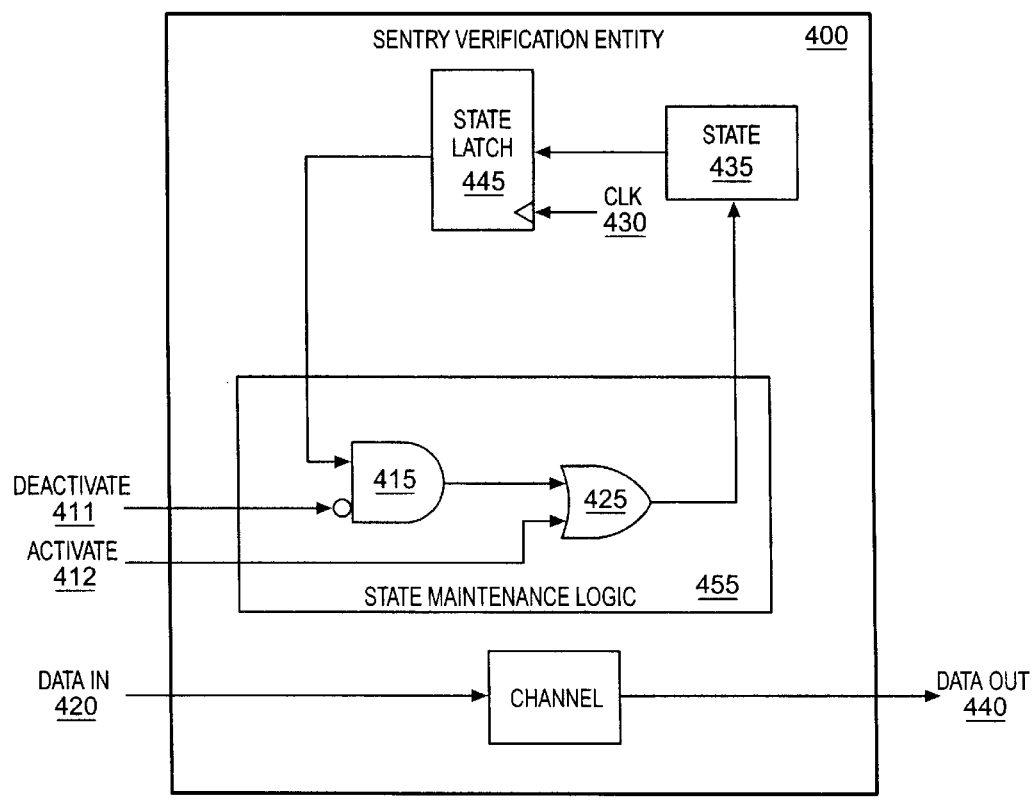
FIG. 4B is a schematic diagram illustrating an exemplary implementation of a Sentry verification entity according to one embodiment.

FIG. 4B is a schematic diagram illustrating an exemplary implementation of a Sentry verification entity 400 according to one embodiment. In the embodiment depicted, the Sentry verification entity 400 includes a state latch 445 to store the current state 435 of a variable. The Sentry verification entity 400 also includes state maintenance logic 455 for maintaining the state 435 or updating the state 435 based upon a deactivate control signal 411 and an activate signal 412. In this example, the state maintenance logic 455 comprises an AND gate 415 and an OR gate 425. The AND gate 415 receives the current state 435 of the corresponding variable from the state latch 445 and an inverted version of the deactivate control signal 411. The OR gate 425 receives the output of the AND gate 415 and the activate control signal 412. Consequently, the state maintenance logic 455 outputs the same state input from the state latch 445 when both the activate control signal 412 and the deactivate control signal 411 are logic 0 thereby holding the variable's current state. The state 435 transitions to active, e.g., logic 1, if the activate control signal is logic 1; and the state 435 transitions to inactive, e.g., logic 0, if the deactivate control signal is logic 1. In this example, the input combination of logic 1 on both the activate control signal 412 and the deactivate control signal 411 is invalid. Importantly, while for simplicity the present example is illustrated with two states, active and inactive, the concept of associating state information with a variable in a hardware design representation by Sentry verification entities is extensible to more than two states. Also, it is appreciated that the implementation of the Sentry verification entity 400 may have many equivalent logical representations than that depicted in FIG. 4B. The implementation of FIG. 4B, therefore, is to be considered merely representative of one or the many various possible logically equivalent implementations.

Figure 4C:
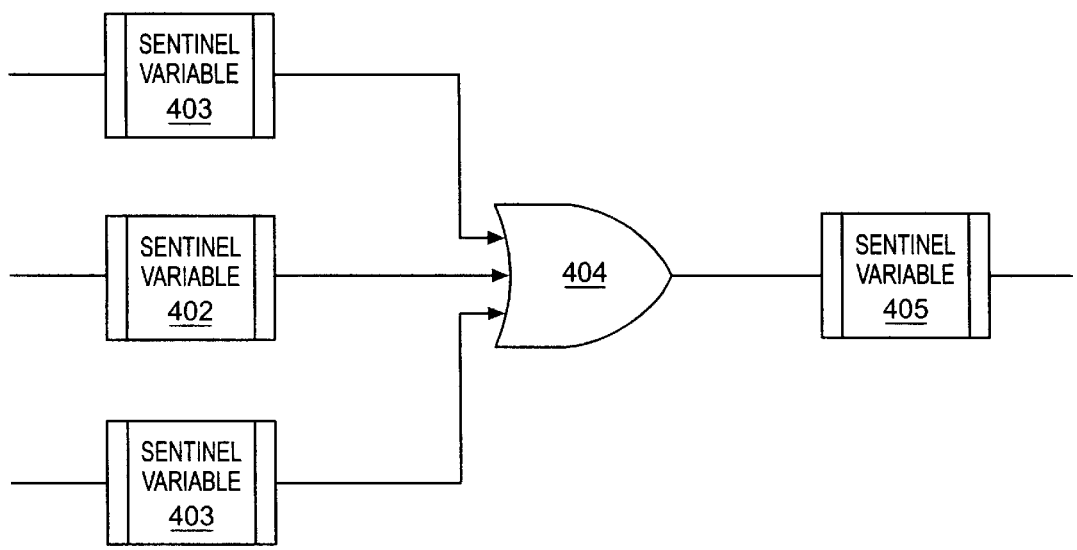
FIG. 4C illustrates what is meant by concept of flow of logical signals according to one embodiment of the present invention.

FIG. 4C illustrates what is meant by concept of intended flow of logical signals according to one embodiment of the present invention. In one embodiment, if a path (not necessarily a "sensitized path") exists between two sentinel variables, then there is a flow of logical signals from one to the other. In this example, since the outputs of sentinel variables 401, 402, and 403 are all electrically coupled to the input of sentinel variable 405 in the resultant hardware component, design verification checks associated with sentinel variable 405 will be a function of at least the state of sentinel variables 401, 402, and 403. Notably, in this example, there is not always a "sensitized path" between each of the sentinel variables 401, 402, and 403 and sentinel variable 405 as the output of any given sentinel variable 401, 402, and 403 does not always have an effect on the value of sentinel variable 405. Consequently, it may be said that a design structure implements the intended flow of logical signals between key elements (e.g., sentinel variables) in the design where the intended flow of logical signals consists of: (1) The logical signal at a key destination design element, at a given time, resulted from the logical signals at a set of key source design elements, at the same or earlier time, and would be different or will not change if a key source signal was different or did not change respectively; (2) The logical signal at a key destination design element, at a given time, independent of the logical signals at a set of key source design elements, at the same or earlier time, and will not change if a key source signal was different, (3) The logical signal at a key source design element, at a given time, should not govern the logical signal at a key destination design element. This intended flow of logical signals can be inferred from the states associated with the key variables and the rules for correct design behavior.

Exemplary Annotations

Various statements that may be used to make up annotations will now be described. According to one embodiment, annotations can be entered in one of two ways:

| (1) A Single Line | // vx statement; |
|---|---|
| (2) Multiple Lines | /* vx code ON |
| | statement; |
| | statement; |
| | */ |

According to one embodiment, any synthesizeable Verilog can also be entered within the context of an annotation to create additional validation checks. Importantly, by placing these annotations within the RTL code itself, the designer performs three tasks in one:

1. Documents the source code through the assertions
2. Identifies assumptions made during block development
3. Prepares the RTL for validation Several built-in constructs may be used in annotations to simplify assertion coding. The examples listed in Table 1 cover common behaviors that many signal groups exhibit. In these examples, the syntax for an annotation comprises a comment delimiter (e.g., "//" or a "/*" "*/" pair), a directive marker (e.g., "vx"), a directive (e.g., "onehot"), and optional directive parameters (e.g., variables i,j, and k).

TABLE 1

Built-in Assertions

| Annotation | Meaning |
|---|---|
| // vx onehot (i, j, k); | Exactly one of i, j, or k must be high |
| // vx onecold (i, j, k); | Exactly one of i, j, or k must be low |
| // vx onetrue (i, j, k); | At most one of i, j, or k can be high |
| // vx onefalse(i, j, k); | At most one of i, j, or k can be low |

Such assertions allow the designer to explicitly specify design constraints for annotated signals. According to one embodiment, techniques are also provided for implicit design constraints based upon the control flow in the circuit. These implicit constraints are thought to be key to both block and interface validation.

In any design, signals are used to coordinate information exchange between different sections of the circuit. Such signals may be the contents of a data bus, or the handshaking signals between two interacting state machines. These key signals are referred to herein as sentinel variables of the design. The purpose of other logic in the circuit is to ensure proper interaction between these signals. A design failure is nothing but the incorrect exchange of data among sentinel variables.

According to one embodiment, sentinel variables are identified in annotations by the "sentry" directive. Sentry verification entities may be used to identify a sentinel signal and to model its behavior. In the examples described herein, Sentry verification entities have two states, active and inactive, that are controlled by "activate" and "deactivate" directives presented in vx annotations. The various Sentry verification entity controls, e.g., in the form of annotations, are placed in the control flow of the design so that the state of the Sentry verification entity is dependent on the state of the design. The Sentry verification entity should be activated when its corresponding sentinel variable carries valid information that is utilized somewhere in the design, and deactivated when the data is invalid or not used. Importantly, according to one embodiment, IDV automatically validates multiple forms of data exchange between sentinel variables to ensure that the exchange is always valid. This checking mechanism works both in block-level and full-chip validation.

The designer is responsible for identifying signals that should be modeled as Sentry verification entities. Common sentinel variables in a design are: handshaking signals, data buses, state variables, and output ports. After sentinel variables have been identified, the designer may add appropriate annotations to the design representation.

Any signal (wire, register, or I/O) may be declared as a Sentry verification entity. A Sentry verification entity may also be declared on a sub-range of a vector. Each Sentry verification entity declaration should also identify a clock signal that controls when the corresponding sentinel variable may change its value. The following are examples of sentry annotations:

| reg a; | // vx sentry a: clk; |
|---|---|
| wire b; | // vx sentry b: clk; |
| reg [0:15] c; | // vx sentry [1:2] c: clk; |

According to one embodiment, Sentry verification entities alternate between active and inactive states based upon the control flow in the design. For instance, a data bus controlled by a state machine may be declared as a Sentry verification entity. When the state machine is in the idle state, the data bus Sentry verification entity is deactivated. Once the state machine enters a transmitting state, the data bus Sentry verification entity is activated. Any other Sentry verification entities in the design that try to access the data bus while it is deactivated will be flagged as an error, such as a "bad data access" error. Similarly, a design defect is indicated if no other Sentry verification entities in the design are accessing the data bus while it is active. For example, a "data loss" may be reported.

According to one embodiment, Sentry verification entities may be activated and deactivated using the annotations in Table 2.

TABLE 2

Exemplary Sentry verification entity controls

| Annotation | Meaning |
|---|---|
| // vx activate(a); | Activate Sentry a: |
| // vx deactivate(a); | Deactivate Sentry a: |

Sentry annotations may be placed within the control flow of the design so that the state of the Sentry verification entity is dependent on the control state. Sentry annotations can also be coded using the "//vx code ON" annotation thereby allowing the designer to code the Sentry verification entity states within their own annotation block separate from the source code for the hardware design representation.

Formulation of Design Verification Checks

Figure 5:
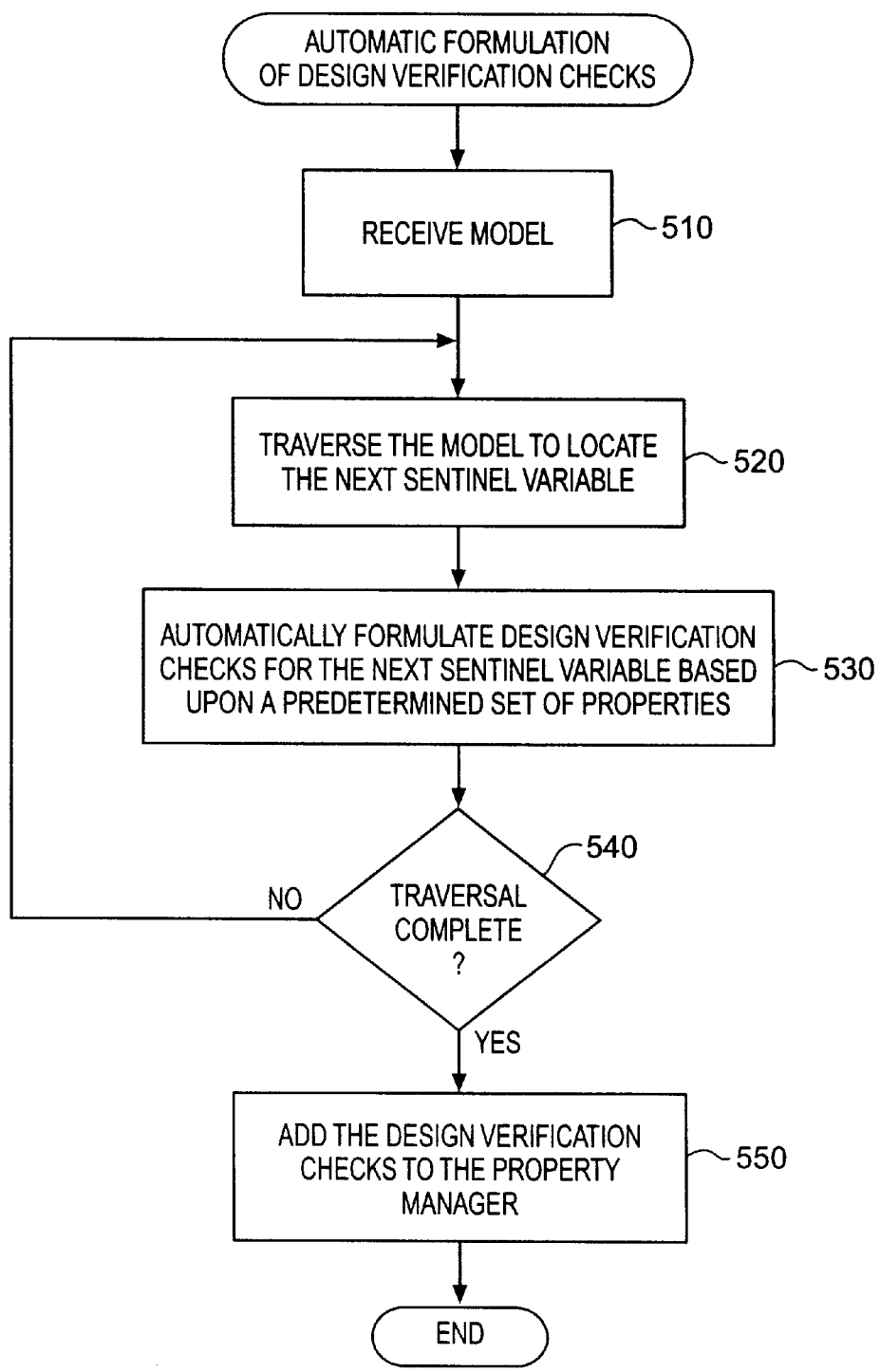
FIG. 5 is a flow diagram that illustrates the automatic formulation of design verification checks according to one embodiment of the present invention.

FIG. 5 is a flow diagram that illustrates the automatic formulation of design verification checks according to one embodiment of the present invention. As described above, properties may be verified by breaking them down into one or more checks and performing verification processing at the check-level. Briefly, according to this example, a set of predetermined properties are applied to each sentinel variable in the design representation. More specifically, the predetermined properties are applied to signal propagation among the sentinel variables to produce an exhaustive list of checks that confirm whether or not the predetermined properties are violated for the intended flow of logical signals.

According to the embodiment depicted, design verification check formulation begins at processing block 510 where a model of the hardware design under test is received. Preferably, the model includes embedded objects, such as Sentry verification entities, associated with each sentinel variable to facilitate check generation. At processing block 520, the model is traversed to locate the next sentinel variable. Upon locating the next sentinel variable, at processing block 530, design verification checks for the sentinel variable are automatically formulated based upon the predetermined properties. For example, each property may be expressed as one or more checks. Further, many of the checks may be expressed at least partially as a function of the states of one or more sentinel variables as described further below.

At processing block 540, a determination is made whether or not the model traversal is complete. If so, processing proceeds to processing block 550. Otherwise, processing returns to processing block 520. At processing block 550, the design verification checks generated in processing block 530 are added to the property manager for subsequent linking and analysis, for example, which are described further below.

Exemplary Properties/Design Verification Checks

Empirical analysis performed by the assignee has shown that verification of a relatively small set of properties at key points of a hardware design representation (e.g., handshaking signals, data buses, state variables, and output ports) can guarantee the absence of errors in the hardware design with a high level of confidence.

An exemplary set of properties will now be described. Importantly, however, the present invention should not be construed as being limited to this particular set of properties. In various circumstances, a subset of the properties described below may be sufficient to achieve the desired level of confidence. Additionally, the set of properties described herein is not intended to be an exhaustive list. It is contemplated that Sentry verification entities and the verification techniques described herein would be equally useful in the context of a larger set of properties or even a completely different set of properties.

In one embodiment, the predefined set of properties applied to signal propagation among the sentinel variables of the hardware design representation include: access of invalid data (AID), loss of valid data (LVD), assertion correctness (AC), conflicting assignments (CA), block enable (BE), assignment execution (AX), constant value memory element (CME), constant value variable (CV), Sentry activate always off (AAO).

AID (Access of Invalid Data) is an undesirable condition. A Sentry verification entity that is in the valid state should not receive data that flowed through a Sentry verification entity that was in the invalid state. Therefore, a solution to one or more checks representing a violation of this property is indicative of a design defect. According to an embodiment of the present invention, an approach for finding AID is to search for an input sequence for the sentinel variable under verification, starting from the reset state, that will: (1) set the corresponding destination Sentry verification entity in the valid state, (2) create a sequentially sensitized path from a source Sentry verification entity to the Sentry verification entity under verification, and (3) set the source Sentry verification entity in the invalid state at the time when the sensitive data was flowing through the destination Sentry verification entity.

LVD (Loss of Valid Data) is another undesirable condition. Any data flowing through a Sentry verification entity that is in the valid state must be received by some Sentry verification entity that is in the valid state. Therefore, a solution to one or more checks representing a violation of this property is indicative of a design defect. According to an embodiment of the present invention, an approach for finding LVD is to search for an input sequence for the sentinel variable under verification, starting from the reset state, that will: (1) set the corresponding source Sentry verification entity in the valid state, and (2a) block the sensitized paths between the source Sentry verification entity and all possible destination Sentry verification entities, or (2b) set the destination Sentry verification entities with sensitized paths from the source Sentry verification entity, in the invalid state.

AC (Assertion Correctness) is a desired condition. An assertion represents a condition the designer explicitly indicated should occur at a particular point in the design. Consequently, a counterexample for compliance with the assertion is indicative of a design defect. According to an embodiment of the present invention, an approach for determining an AC violation is to search for an input sequence for the sentinel variable under verification, starting from the reset state, that will be a counterexample for the assertion.

The remaining properties (i.e., conflicting assignments, block enable, assignment execution, constant value memory element, constant value variable, and Sentry activate always off) may be verified in a similar manner. However, for sake of brevity, checking algorithms for these properties will not be described. Rather, only brief descriptions will be provided. CA (Conflicting Assignments) is an undesirable condition where a wire in the design can be driven by multiple conflicting drivers. BE (Block Enable) checks if the condition enabling the execution of a certain block of code in the HDL will never be enabled. AX (Assignment Execution) checks to see if each logical value can be assigned to a variable through each assignment. CME (Constant Value Memory Element) checks to see if a memory element in the design will always hold a constant value. CV (Constant Value Variable) checks to see if a variable in the design will always hold a constant value. AAO (Sentry Activate Always Off) is an undesirable condition indicative of an error in the specification of the design intent where a sentry verification entity is never set in active state.

An Exemplary Design Example

In the design example illustrated by FIGS. 6–9, it is assumed that there is a need for three independent units, such as microprocessors, client A 605, client B 610, and client C 615, that are required to share access to the same memory 640, such as a synchronous RAM. In this design example, it is assumed that the memory 640 requires a single read/write signal. The following data/control signals are therefore needed from each unit: (1) Address—10 bits, (2) Write data—8 bits, (3) Read data—8 bits, and (4) Read/write—1 bit. As a result, an arbiter, such as round robin arbiter 636, has been designed that accepts data from each unit 605, 610, and 615 and arbitrates to determine which one is granted access to the memory 640 at any one time. Each unit 605, 610, and 615 will initiate a memory request signal when it wants access to the memory 640 and will deactivate it when finished. If more than one unit 605, 610, and 615 requests the bus 641 at the same time, access should be grated on a "round-robin" basis so that no one unit 605, 610, or 615 is locked out while another has continuous access. Continuous access is granted to any one unit 605, 610, or 615 for a period of time, up to a number of clock cycles separately programmable from client A's data bus 606. When a programmable "watch dog" time has not been set, an 8 clock cycle delay should default. For speed purposes, the use of Tri-state buffers, rather than multiplexers is desirable.

Figure 6A:
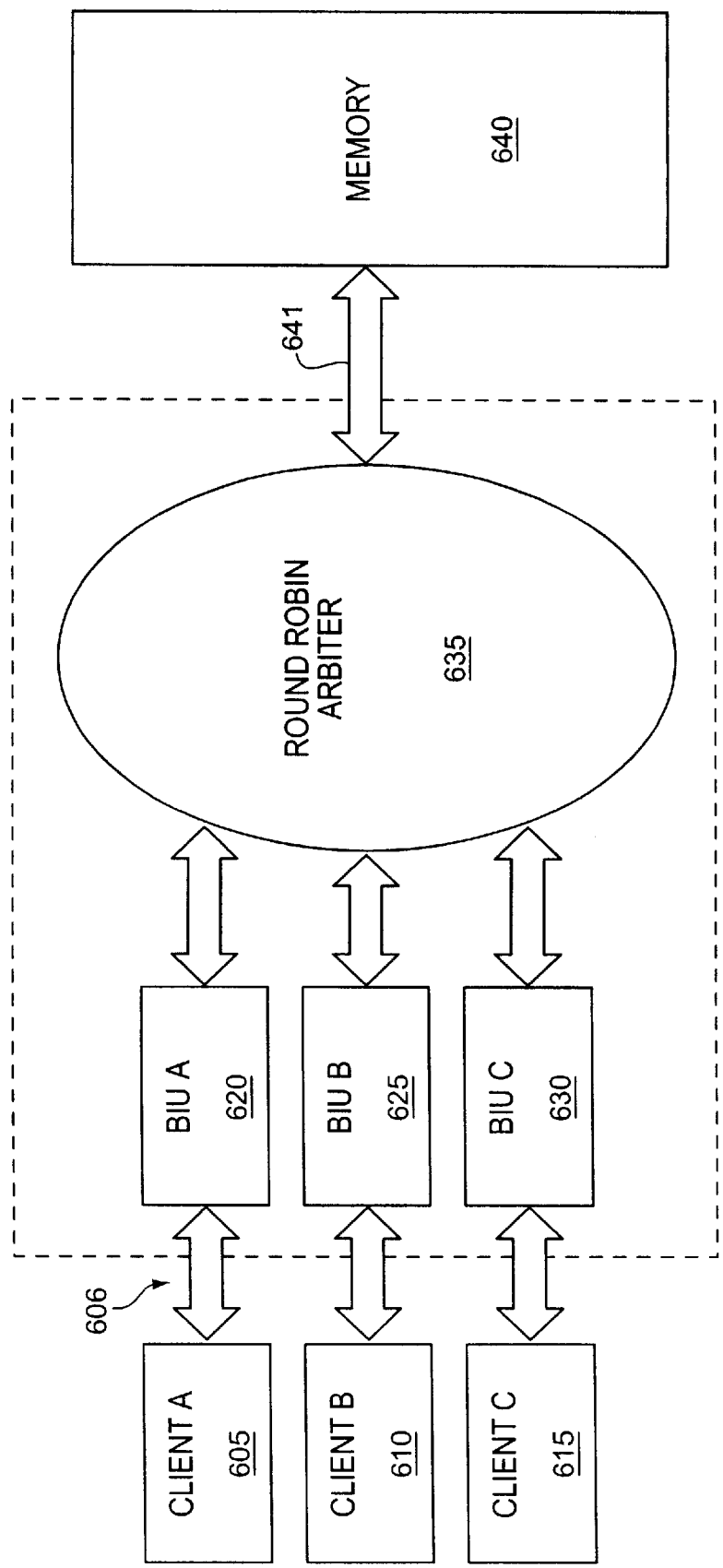
FIG. 6A is a block diagram illustrating a design example.
Figure 6B:
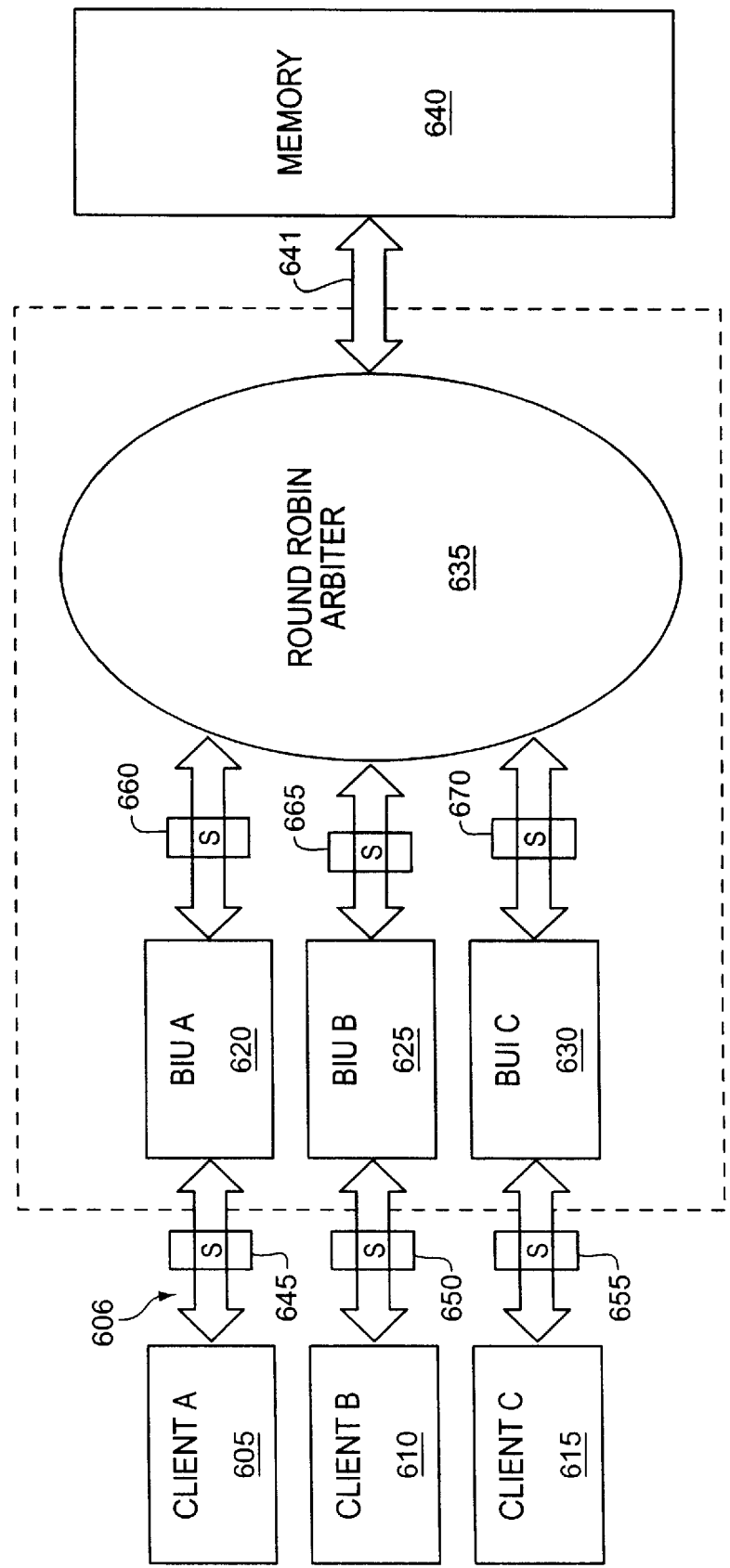
FIG. 6B is a block diagram illustrating the design example of FIG. 6A with the inclusion of Sentry verification entities.
Figure 7:
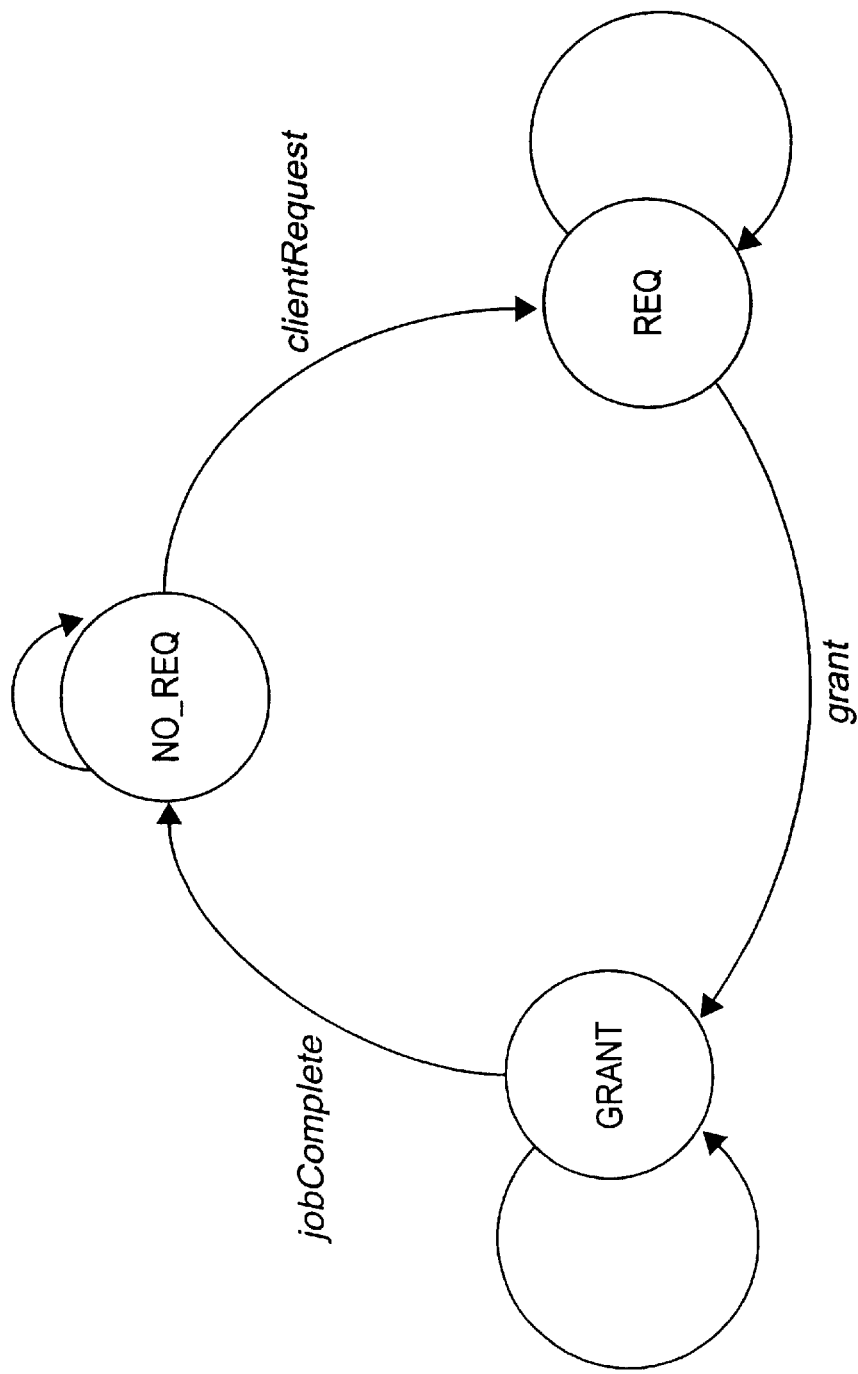
FIG. 7 is a state diagram illustrating the operation of the bus interface units of FIGS. 6A and 6B.
Figure 8:
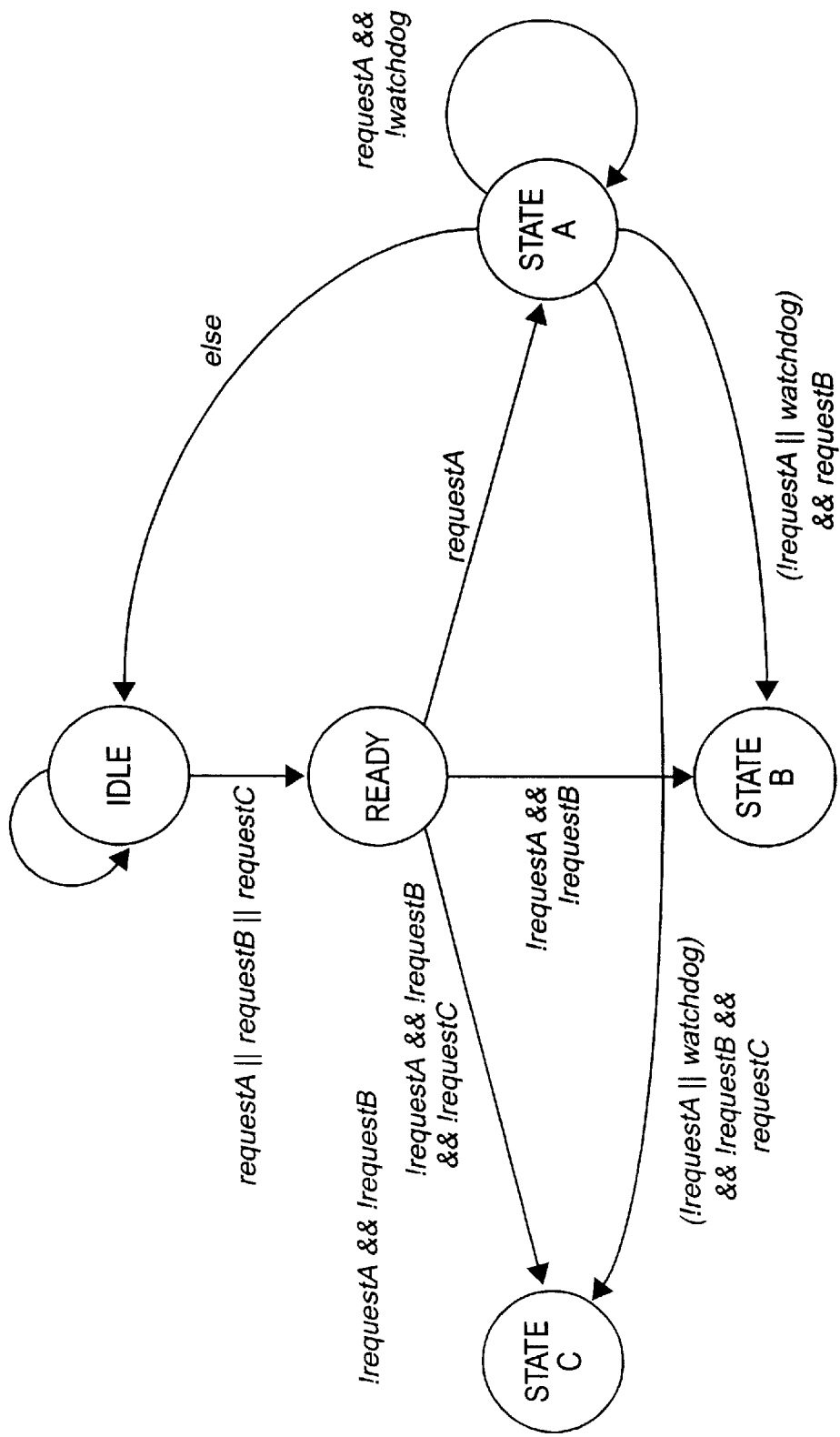
FIG. 8 is a simplified state diagram illustrating the operation of the round robin arbiter of FIGS. 6A and 6B.

FIG. 6B is a block diagram illustrating the design example of FIG. 6A with the inclusion of Sentry verification entities at appropriate points of the circuit corresponding to the RTL representation of FIGS. 9A–9E. Thus, FIG. 6B conceptually illustrates the internal model representation after the model builder 145 embeds Sentry verification entities 645, 650, 655, 660, 665, and 670; and as seen by the design intent analyzer 140 and the analysis engine 180.

In this example, the Sentry verification entities 645, 650, 655, 660, 665, and 670 have been chosen to (1) verify the operation of the signals between clients 605, 610, and 615 and bus interface units (BIUs) 620, 625, and 630, respectively; and (2) verify the operation of the signals between the BIUs 620, 625, 630 and the round robin arbiter 635. The data signals (i.e., dataA, dataB, and dataC) flowing from clients 605, 610, and 615 to bus interface units (BIUs) 620, 625, and 630, respectively, are declared as sentinel variables at line 20 of FIG. 9A. The data signals (i.e., dataOut) flowing from BIUs 620, 625, and 630 to clients 605, 610, and 615, respectively, are declared as sentinel variables at line 50 of FIG. 9B. The data signals (i.e., dataA, dataB, and dataC) received by the round robin arbiter 635 are declared as sentinel variables at line 115 of FIG. 9C.

The states associated with the Sentry verification entities 645, 650, 655, 660, 665, and 670 at different points of the control flow are controlled by way of annotations at line 21 of FIG. 9A, at lines 73, 81, and 91 of FIG. 9B, at line 131 of FIG. 9C, and at lines 156, 169, and 180 of FIG. 9D. In this example, therefore, the designer has expressed his/her intent that (1) the Sentry verification entities associated with dataA, dataB, and dataC remain active constantly in module main; (2) on reset, the Sentry verification entity associated with dataOut is deactive; (3) the Sentry verification entity associated with dataOut is deactive when the corresponding BIU is in the "NO_REQ" state and active when the corresponding BIU is in the "GRANTED" state; (4) the Sentry verification entities associated with dataA, dataB, and dataC are deactive during state transition of the round robin arbiter 635; and (5) the Sentry verification entities associated with dataA, dataB, and dataC are activated when the round robin arbiter is in "stateA", "stateB", and "stateC", respectively, thereby allowing only one of dataA, dataB, and dataC to be active at any given time.

An exemplary text report file illustrating the verification results for the annotated RTL of FIGS. 9A–9E will be described below with reference to FIGS. 13A–13E.

Linking

As mentioned above, the property manager 165 may track information regarding relationships among the various design verification checks generated by the design intent analyzer. In the embodiments described herein, the linking process is performed concurrently with verification of the checks. In alternative embodiments, however, linking and verification processing may be performed separately. In any event, the dependency relationships (or "linking" information) may be used to facilitate error reporting or used to streamline check verification processing.

Figure 10:
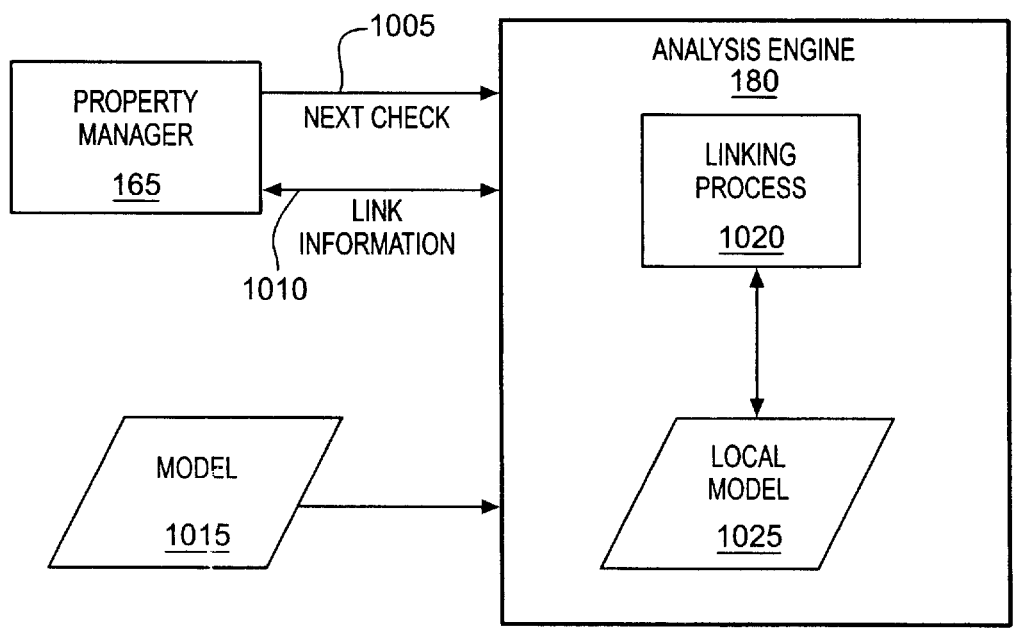
FIG. 10 is a block diagram that conceptually illustrates linking processing according to one embodiment of the present invention.

FIG. 10 is a block diagram that conceptually illustrates linking processing according to one embodiment of the present invention. According to this example, link processing involves both the property manager 165 and the analysis engine 180. The property manager 165 provides the next check 1005 to be processed to the analysis engine 180; and the analysis engine 180 returns link information 1010, such as whether or not the currently processed check is dependent upon another check and if so, which check. The analysis engine 180 includes a linking process 1020 and a local model 1025. The local model 1025 is initialized with a copy of the model 1015 generated by the model builder. However, during link processing, the local model is modified to disable various checks.

Figure 11:
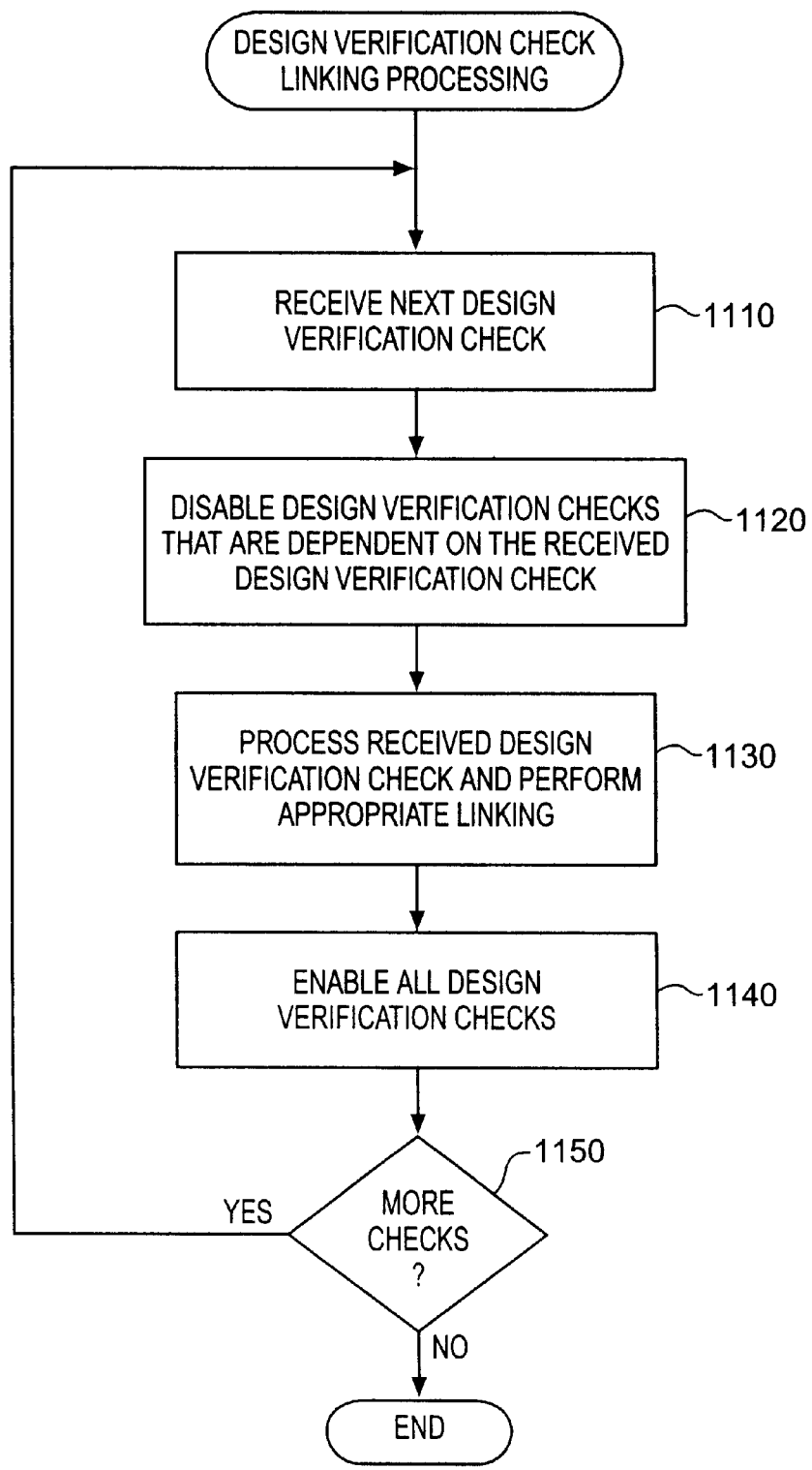
FIG. 11 is a high-level flow diagram that illustrates linking processing according to one embodiment of the present invention.

FIG. 11 is a high-level flow diagram that illustrates linking processing according to one embodiment of the present invention. At processing block 1110, the next design verification check is received by the analysis engine 180 from the property manager 165. In order to avoid circular dependency relationships, those design verification checks that are already known to be dependent upon the received design verification check are disabled in the local model 1025 at processing block 1120. The received design verification check is evaluated at processing block 1130 and appropriate linking is also performed. Then, at processing block 1140, all of the design verification checks are enabled in anticipation of further check processing. Finally, at decision block 1150, a determination is made whether or not there are more checks to be processed. If so, control flow returns to processing block 1110. Otherwise, link processing is complete.

Figure 12:
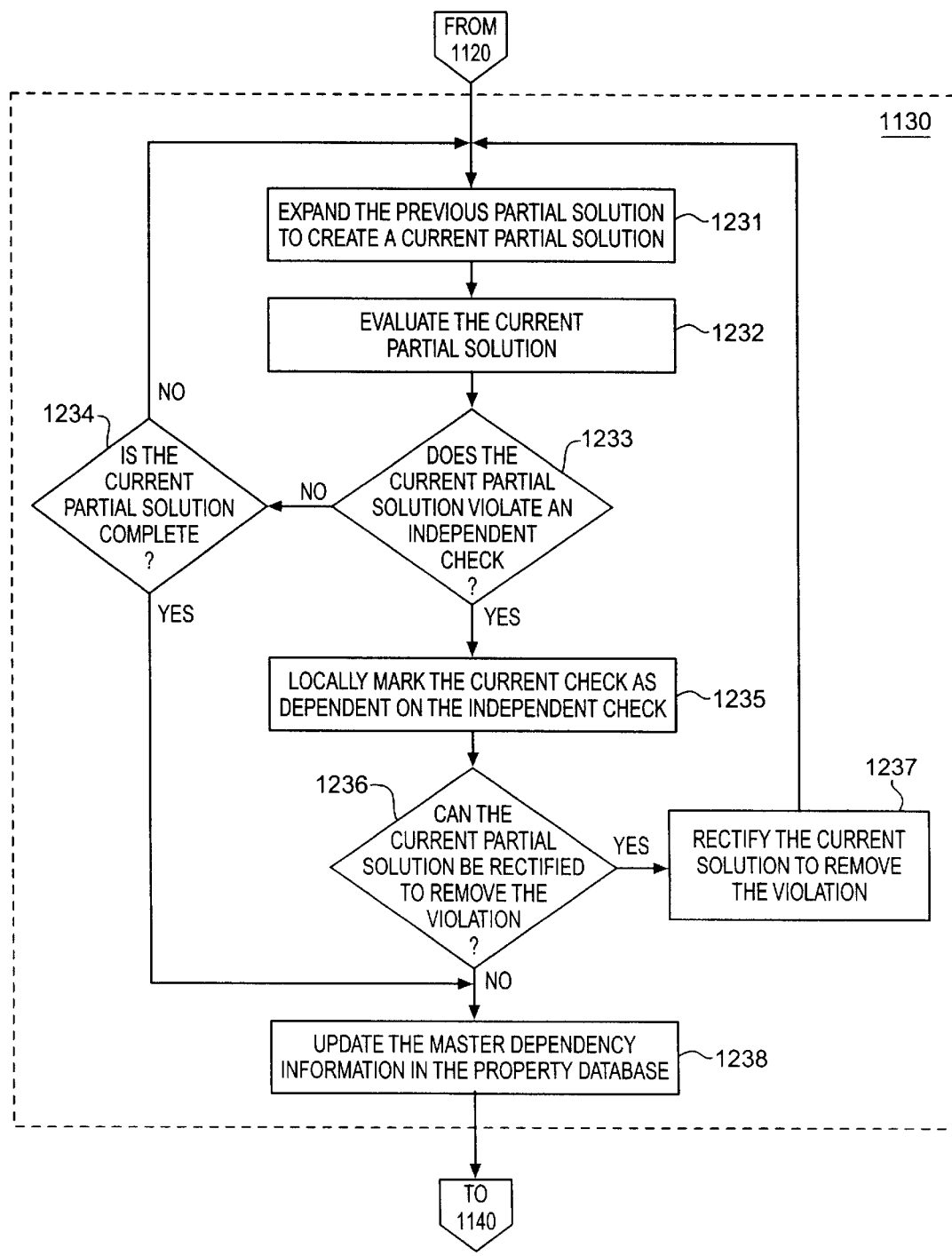
FIG. 12 is a flow diagram that illustrates processing block 1130 of FIG. 11 according to one embodiment of the present invention.

FIG. 12 is a flow diagram that illustrates processing block 1130 of FIG. 11 according to one embodiment of the present invention. Processing of the received design verification check begins at processing block 1231 where the previous partial solution is expanded to create a current partial solution. Next, at processing block 1232, the current partial solution is evaluated; and a determination is made at processing block 1233 whether or not the current partial solution violates an independent check. If it is determined that the current partial solution violates an independent check, then processing proceeds to processing block 1235. Otherwise, processing branches to decision block 1234.

At decision block 1234 the current partial solution is tested to determine whether or not it is complete. If the current partial solution is complete, then the currently processed check is marked as an independent check and processing continues with processing block 1238. Otherwise, if the current partial solution is not complete, then processing returns to processing block 1231.

Assuming the current partial solution has been found to violate an independent check, then at processing block 1235, the current check is temporarily locally marked as being dependent upon the independent check. At processing block, a determination is made whether or not the current partial solution can be rectified to remove the violation of the independent check. If the current partial solution can be so rectified, then processing proceeds to processing block 1237. Otherwise, processing continues with processing block 1238. At processing block 1237, the current solution is rectified to remove the violation and control flow returns to processing block 1231.

Finally, at processing block 1238, the local dependency information is used to update the master dependency information in the property database 160. In this manner, an intent violation hierarchy may be built for use during reporting of design defects.

Intent Violation Reporting

FIGS. 13A–13E illustrate an exemplary text report file for the annotated RTL of FIGS. 9A–9E according to one embodiment of the present invention. In this example, a summary of the functional checks is listed at lines 5 through 17. The summary indicates a total of five failed checks, three inconclusive checks, twelve interface checks, and 144 passed checks (some of which may be conditional). A summary of the failed checks is listed at lines 27 through 38. One block enable violation is reported at line 31, one assignment execution violation is reported at line 32, and three occurrences of loss of valid data are reported at line 38 of FIG. 13A. Exemplary detailed debugging information regarding the property violations is shown in FIG. 13B.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus for detecting errors in a hardware design, the apparatus comprising:
   a storage device having stored therein one or more design analysis routines to verify design integrity of a hardware design described in a hardware description language (HDL), conforming to a particular methodology, and employing a particular form of annotations to the HDL; and
   a processor coupled to the storage device to execute the one or more design analysis routines to receive the hardware design, receive one or more indications of design intent, produce a failure model, and detect existence of one or more errors in the hardware design, wherein:
      the one or more indications of design intent are received by extracting the one or more indications of design intent from the annotations to the HDL,
      the failure model is produced by generating a plurality of design verification checks based upon the HDL and the design intent, each of the plurality of design verification checks being symptomatic of one or more errors in the hardware design, and
      the existence of the one or more errors in the hardware design are detected by analyzing each design verification check of the plurality of design verification checks.

2. The apparatus of claim 1, wherein the one or more design analysis routines, when executed, further identify one or more key points in the hardware design based upon the design intent.

3. The apparatus of claim 1, wherein the HDL comprises VHDL.

4. The apparatus of claim 1, wherein the HDL comprises Verilog.

5. The apparatus of claim 1, wherein the one or more indications of design intent comprise information regarding a state associated with a variable in the HDL.

6. The apparatus of claim 5, wherein the plurality of design verification checks include one or more rules relating to signal propagation, and wherein said detecting existence of the one or more errors in the design by analyzing each design verification check of the plurality of design verification checks includes evaluating whether a signal associated with the variable is propagated in accordance with the one or more rules.

7. The apparatus of claim 6, wherein one or more of the plurality of design verification checks are violated if the signal causes data flow activity in the hardware design while the state of the variable is inactive.

8. The apparatus of claim 6, wherein one or more of the plurality of design verification checks are violated if the signal does not cause data flow activity in the hardware design while the state of the variable is active.

9. A method of detecting errors in a hardware design comprising:
   receiving a representation of a hardware design and information regarding an intended flow of logical signals among a plurality of variables in the representation;
   extracting the information regarding the intended flow from one or more inline annotations embedded within the representation of the hardware design, the one or more inline annotations having a predetermined format including a comment start marker, a directive marker, and a directive name; and
   inferring existence of one or more errors in the representation of the hardware design based upon the information regarding the intended flow of logical signals by translating the information regarding the intended flow of logical signals into a plurality of design verification checks, each of the plurality of design verification checks representing a condition that must hold true in order for the hardware design to operate in accordance with the intended flow of logical signals, and
   determining whether one or more of the plurality of design verification checks are violated by the hardware design.

10. The method of claim 9, further comprising identifying one or more key points in the hardware design based upon the information regarding the intended flow of logical signals.

11. The method of claim 9, wherein the hardware design is expressed in a hardware description language (HDL).

12. The method of claim 11, wherein information regarding the intended flow of logical signals is captured from semantics of the HDL.

13. The method of claim 12, further including determining the intended flow of logical signals through one or more of the plurality of variables by interpreting the information regarding the intended flow based upon its context.

14. The method of claim 13, wherein the context of the information regarding the intended flow comprises its position within a control flow structure associated with the representation of the hardware design.

15. The method of claim 11, wherein the HDL comprises VHDL.

16. The method of claim 11, wherein the HDL comprises Verilog.

17. The method of claim 9, wherein the directive marker comprises "vx".

18. The method of claim 9, further comprising reporting the existence of the one or more errors.

19. The method of claim 9, wherein the information regarding the intended flow of logical signals among a plurality of variables in the representation includes information regarding a state associated with a variable of the plurality of variables.

20. The method of claim 19, wherein the plurality of design verification checks include one or more rules relating to signal propagation, and wherein the method further comprises evaluating whether a signal associated with the variable is propagated in accordance with the one or more rules.

21. The method of claim 20, wherein one or more of the plurality of design verification checks are violated if the signal is capable of causing data flow activity in the hardware design while the variable is in an inactive state.

22. The method of claim 20, wherein one or more of the plurality of design verification checks are violated if the signal is incapable of causing data flow activity in the hardware design while the variable is in an active state.

23. The method of claim 9, wherein the information regarding the intended flow of logical signals comprises implied design intent that is inferred from the hardware design and a set of predetermined properties including one or more of:
    a block enable property that relates to whether conditions enabling execution of a particular block of code in the representation will never be satisfied;
    an assignment execution property that relates to checking whether each logical value can be assigned to a variable in the representation through assignment operations appearing in the representation;
    a conflicting assignments property that relates to checking whether a wire in the hardware design is driven by multiple conflicting drivers;
    a constant value memory element property that relates to determining whether a memory element in the hardware design will always hold a constant value; and
    a constant value variable property that relates to determining whether a variable in the representation will always hold a constant value.

24. The method of claim 9, wherein the information regarding the intended flow of logical signals includes information regarding expressed design intent explicitly conveyed by a designer by way of intent modeling semantics of the representation.

25. The method of claim 9, further comprising embedding one or more verification entities into the hardware design during verification processing to facilitate verification and modeling of the intended flow of logical signals.

26. A method of detecting errors in a hardware design comprising:
    receiving a representation of a hardware design and information regarding an intended flow of logical signals among a plurality of variables in the representation, the information regarding the intended flow of logical signals specifying desired temporal behavior among the logical signals from which inferences are drawn regarding integrity of data conveyed by the logical signals;
    extracting the information regarding the intended flow from one or more inline annotations embedded within the representation of the hardware design, the one or more inline annotations having a predetermined format including a comment start marker, a directive marker, and a directive name;
    translating the information regarding the intended flow of logical signals into a plurality of design verification checks, each of the plurality of design verification checks representing a condition that must hold true in order for the hardware design to operate in accordance with the intended flow of logical signals; and
    detecting existence of one or more errors in the hardware design by determining if one or more of the plurality of design verification checks are violated by the hardware design.

27. The method of claim 26, wherein at least a portion of the information regarding the intended flow of logical signals is captured from semantics of the representation.

28. The method of claim 27, wherein the information regarding the intended flow of logical signals is determined by interpreting context of the semantics within a control flow structure associated with the representation.

29. The method of claim 27, wherein the representation comprises a hardware description language (HDL).

30. The method of claim 29, wherein the HDL comprises VHDL.

31. The method of claim 29, wherein the HDL comprises Verilog.

32. The method of claim 26, wherein the representation comprises a high-level programming language.

33. A method of detecting errors in a hardware design comprising:
    receiving a representation of a hardware design and information regarding an intended flow of logical signals among a plurality of variables in the representation, the information regarding the intended flow of logical signals comprises implied design intent that is inferred from the hardware design and a set of predetermined properties including one or more of:
        a block enable property that relates to whether conditions enabling execution of a particular block of code in the representation will never be satisfied,
        an assignment execution property that relates to checking whether each logical value can be assigned to a variable in the representation through assignment operations appearing in the representation,
        a conflicting assignments property that relates to checking whether a wire in the hardware design is driven by multiple conflicting drivers,
        a constant value memory element property that relates to determining whether a memory element in the hardware design will always hold a constant value, and
        a constant value variable property that relates to determining whether a variable in the representation will always hold a constant value; and
    inferring existence of one or more errors in the representation of the hardware design based upon the information regarding the intended flow of logical signals by translating the information regarding the intended flow of logical signals into a plurality of design verification checks, each of the plurality of design verification checks representing a condition that must hold true in order for the hardware design to operate in accordance with the intended flow of logical signals, and
    determining whether one or more of the plurality of design verification checks are violated by the hardware design.

34. The method of claim 33, further comprising identifying one or more key points in the hardware design based upon the information regarding the intended flow of logical signals.

35. The method of claim 33, wherein the hardware design is expressed in a hardware description language (HDL).

36. The method of claim 35, wherein information regarding the intended flow of logical signals is captured from semantics of the HDL.

37. The method of claim 36, further including determining the intended flow of logical signals through one or more of the plurality of variables by interpreting the information regarding the intended flow based upon its context.

38. The method of claim 37, wherein the context of the information regarding the intended flow comprises its position within a control flow structure associated with the representation of the hardware design.

39. The method of claim 35, wherein the HDL comprises VHDL.

40. The method of claim 35, wherein the HDL comprises Verilog.

41. The method of claim 33, further including extracting the information regarding the intended flow from one or more inline annotations embedded within the representation of the hardware design.

42. The method of claim 41, wherein the one or more inline annotations have a predetermined format including a comment start marker, a directive marker, and a directive name.

43. The method of claim 33, wherein the information regarding the intended flow of logical signals comprises information regarding intended behavior of the logical signals.

44. The method of claim 33, wherein the information regarding the intended flow of logical signals among one or more of the plurality of variables is provided by way of a file separate from that containing the hardware design.

45. The method of claim 33, further comprising reporting the existence of the one or more errors.

46. The method of claim 33, wherein the information regarding the intended flow of logical signals among a plurality of variables in the representation includes information regarding a state associated with a variable of the plurality of variables.

47. The method of claim 46, wherein the plurality of design verification checks include one or more rules relating to signal propagation, and wherein the method further comprises evaluating whether a signal associated with the variable is propagated in accordance with the one or more rules.

48. The method of claim 47, Wherein one or more of the plurality of design verification checks are violated if the signal is capable of causing data flow activity in the hardware design while the variable is in an inactive state.

49. The method of claim 47, wherein one or more of the plurality of design verification checks are violated if the signal is incapable of causing data flow activity in the hardware design while the variable is in an active state.

50. The method of claim 33, wherein the information regarding the intended flow of logical signals includes information regarding expressed design intent explicitly conveyed by a designer by way of intent modeling semantics of the representation.

51. The method of claim 33, further comprising embedding one or more verification entities into the hardware design during verification processing to facilitate verification and modeling of the intended flow of logical signals.

52. A machine-readable medium having stored thereon data representing instructions which, when executed by a processor, cause said processor to:

receive a representation of a hardware design and information regarding an intended flow of logical signals among a plurality of variables in the representation, the information regarding the intended flow of logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value; and infer existence of one or more errors in the hardware design based upon the information regarding the intended flow of logical signals by translating the information regarding the intended flow of logical signals into a plurality of design verification checks, each of the plurality of design verification checks representing a condition that must hold true in order for the hardware design to operate in accordance with the intended flow of logical signals, and determining whether one or more of the plurality of design verification checks are violated by the hardware design.

53. The machine-readable medium of claim 52, wherein the hardware design is expressed in a high-level programming language.

54. The machine-readable medium of claim 53, wherein the high-level programming language comprises C.

55. The machine-readable medium of claim 53, wherein the high-level programming language comprises C++.

56. The machine-readable medium of claim 52, wherein the hardware design is expressed in a hardware description language (HDL).

57. The machine-readable medium of claim 52, wherein the information regarding the intended flow of logical signals comprises information regarding intended behavior of the logical signals.

58. The method of claim 52, wherein the information regarding the intended flow of logical signals includes information regarding expressed design intent explicitly conveyed by a designer by way of intent modeling semantics of the representation.

59. The method of claim 52, further comprising embedding one or more verification entities into the hardware design during verification processing to facilitate verification and modeling of the intended flow of logical signals.

60. A machine-readable medium having stored thereon data representing instructions which, when executed by a processor, cause said processor to:

receive a representation of a hardware design and information regarding an intended flow of logical signals among a plurality of variables in the representation, the information regarding the intended flow of logical signals indicating one or more of desired temporal behavior and desired functional behavior of the logical signals from which inferences are drawn regarding integrity of data conveyed by the logical signals, wherein the information regarding the intended flow of logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

translate the information regarding the intended flow of logical signals into a plurality of design verification checks, each of the plurality of design verification checks representing a condition that must hold true in order for the hardware design to operate in accordance with the intended flow of logical signals; and detect existence of one or more errors in the hardware design by determining whether one or more of the plurality of checks are violated by the hardware design.

61. The machine-readable medium of claim 60, wherein the machine-readable medium comprises a data signal embodied in a propagation medium.

62. The method of claim 60, wherein the information regarding the intended flow of logical signals includes information regarding expressed design intent explicitly conveyed by a designer by way of intent modeling semantics of the representation.

63. The method of claim 60, further comprising embedding one or more verification entities into the hardware design during verification processing to facilitate verification and modeling of the intended flow of logical signals.

64. A machine-readable medium having stored thereon data representing instructions which, when executed by a processor, cause said processor to:

receive a hardware design described in a hardware description language (HDL);

receive one or more indications of design intent, the one or more indications of design intent include information regarding implied design intent that is inferred from the hardware design by applying one or more predetermined properties to signal propagation among one or more variables in the HDL, the one or more predetermined properties include a block enable property that relates to whether conditions enabling execution of a particular block of code in the HDL will never be satisfied;

produce a failure model by generating a plurality of design verification checks based upon the HDL and the design intent, each of the plurality of design verification checks symptomatic of one or more errors in the hardware design; and detect existence of one or more errors in the hardware design by analyzing each design verification check of the plurality of design verification checks.

65. The machine-readable medium of claim 64, wherein the machine-readable medium comprises a data signal embodied in a propagation medium.

66. The machine-readable medium of claim 64, wherein the one or more indications of design intent include information regarding expressed design intent explicitly conveyed by a designer by way of intent modeling semantics of the HDL.

67. The machine-readable medium of claim 64, wherein the one or more predetermined properties are based upon expected behaviors that should occur within standard design practices.

68. The machine-readable medium of claim 64, wherein the one or more predetermined properties include one or more of:

an assignment execution property that relates to checking whether each logical value can be assigned to a variable in the representation through assignment operations appearing in the representation;

a conflicting assignments property that relates to checking whether a wire in the hardware design is driven by multiple conflicting drivers;

a constant value memory element property that relates to determining whether a memory element in the hardware design will always hold a constant value; and a constant value variable property that relates to determining whether a variable in the representation will always hold a constant value.

69. A machine-readable medium having stored thereon data representing instructions which, when executed by a processor, cause said processor to:

receive a hardware design described in a hardware description language (HDL);

receive one or more indications of design intent, the one or more indications of design intent include information regarding implied design intent that is inferred from the hardware design by applying one or more predetermined properties to signal propagation among one or more variables in the HDL, the one or more predetermined properties include an assignment execution property that relates to checking whether each logical value can be assigned to a variable in the HDL through assignment operations appearing in the HDL;

produce a failure model by generating a plurality of design verification checks based upon the HDL and the design intent, each of the plurality of design verification checks symptomatic of one or more errors in the hardware design; and detect existence of one or more errors in the hardware design by analyzing each design verification check of the plurality of design verification checks.

70. The machine-readable medium of claim 69, wherein the machine-readable medium comprises a data signal embodied in a propagation medium.

71. The machine-readable medium of claim 69, wherein the one or more indications of design intent include information regarding expressed design intent explicitly conveyed by a designer by way of intent modeling semantics of the HDL.

72. The machine-readable medium of claim 69, wherein the one or more predetermined properties are based upon expected behaviors that should occur within standard design practices.

73. A machine-readable medium having stored thereon data representing instructions which, when executed by a processor, cause said processor to:

receive a hardware design described in a hardware description language (HDL);

receive one or more indications of design intent, the one or more indications of design intent include information regarding implied design intent that is inferred from the hardware design by applying one or more predetermined properties to signal propagation among one or more variables in the HDL, the one or more predetermined properties include a conflicting assignments property that relates to checking whether a wire in the hardware design is driven by multiple conflicting drivers;

produce a failure model by generating a plurality of design verification checks based upon the HDL and the design intent, each of the plurality of design verification checks symptomatic of one or more errors in the hardware design; and detect existence of one or more errors in the hardware design by analyzing each design verification check of the plurality of design verification checks.

74. The machine-readable medium of claim 73, wherein the machine-readable medium comprises a data signal embodied in a propagation medium.

75. The machine-readable medium of claim 73, wherein the one or more indications of design intent include information regarding expressed design intent explicitly conveyed by a designer by way of intent modeling semantics of the HDL.

76. The machine-readable medium of claim 73, wherein the one or more predetermined properties are based upon expected behaviors that should occur within standard design practices.

77. A machine-readable medium having stored thereon data representing instructions which, when executed by a processor, cause said processor to:

receive a hardware design described in a hardware description language (HDL);

receive one or more indications of design intent, the one or more indications of design intent include information regarding implied design intent that is inferred from the hardware design by applying one or more predetermined properties to signal propagation among one or more variables in the HDL, the one or more predetermined properties include a constant value memory element property that relates to determining whether a memory element in the hardware design will always hold a constant value;

produce a failure model by generating a plurality of design verification checks based upon the HDL and the design intent, each of the plurality of design verification checks symptomatic of one or more errors in the hardware design; and detect existence of one or more errors in the hardware design by analyzing each design verification check of the plurality of design verification checks.

78. The machine-readable medium of claim 77, wherein the machine-readable medium comprises a data signal embodied in a propagation medium.

79. The machine-readable medium of claim 77, wherein the one or more indications of design intent include information regarding expressed design intent explicitly conveyed by a designer by way of intent modeling semantics of the HDL.

80. The machine-readable medium of claim 77, wherein the one or more predetermined properties are based upon expected behaviors that should occur within standard design practices.

81. A machine-readable medium having stored thereon data representing instructions which, when executed by a processor, cause said processor to:

receive a hardware design described in a hardware description language (HDL);

receive one or more indications of design intent, the one or more indications of design intent include information regarding implied design intent that is inferred from the hardware design by applying one or more predetermined properties to signal propagation among one or more variables in the HDL, the one or more predetermined properties include a constant value variable property that relates to determining whether a variable in the HDL will always hold a constant value;

produce a failure model by generating a plurality of design verification checks based upon the HDL and the design intent, each of the plurality of design verification checks symptomatic of one or more errors in the hardware design; and detect existence of one or more errors in the hardware design by analyzing each design verification check of the plurality of design verification checks.

82. The machine-readable medium of claim 81, wherein the machine-readable medium comprises a data signal embodied in a propagation medium.

83. The machine-readable medium of claim 81, wherein the one or more indications of design intent include information regarding expressed design intent explicitly conveyed by a designer by way of intent modeling semantics of the HDL.

84. The machine-readable medium of claim 81, wherein the one or more predetermined properties are based upon expected behaviors that should occur within standard design practices.

85. A machine-readable medium having stored thereon data representing instructions which, when executed by a processor, cause said processor to:

receive a representation of a hardware design and information regarding an intended behavior of logical signals associated with a plurality of variables in the representation, the information regarding the intended behavior of the logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

infer existence of one or more errors in the hardware design based upon the information regarding the intended behavior of the logical signals by translating the information regarding the intended behavior of the logical signals into a plurality of design verification checks, each of the plurality of design verification checks representing a condition that must hold true in order for the hardware design to operate in accordance with the intended behavior of the logical signals, and determining if one or more of the plurality of design verification checks are violated by the hardware design.

86. The machine-readable medium of claim 85, wherein the hardware design is expressed in a high-level programming language.

87. The machine-readable medium of claim 86, wherein the high-level programming language comprises C.

88. The machine-readable medium of claim 86, wherein the high-level programming language comprises C++.

89. The machine-readable medium of claim 85, wherein the hardware design is expressed in a hardware description language (HDL).

90. A machine-readable medium having stored thereon data representing instructions which, when executed by a processor, cause said processor to:

receive a representation of a hardware design and information regarding an intended flow of logical signals among a plurality of variables in the representation, the information regarding the intended flow of logical signals indicating one or more of desired temporal behavior and desired functional behavior of the logical signals from which inferences are drawn regarding the integrity of data conveyed by the logical signals, the information regarding the intended flow of logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

translate the information regarding the intended flow of logical signals into a plurality of design verification checks, each of the plurality of design verification checks representing a condition that must hold true in order for the hardware design to operate in accordance with the intended flow of logical signals; and detect existence of one or more errors in the hardware design by determining if one or more of the plurality of checks can be violated by the hardware design.

91. The machine-readable medium of claim 90, wherein the machine-readable medium comprises a data signal embodied in a propagation medium.

92. The machine-readable medium of claim 90, wherein the information regarding the intended flow of logical signals is captured from semantics of the representation.

93. The machine-readable medium of claim 92, wherein the information regarding the intended flow of logical signals is determined by interpreting context of the semantics within a control flow structure associated with the representation.

94. The machine-readable medium of claim 90, wherein the representation comprises a hardware description language (HDL).

95. The machine-readable medium of claim 94, wherein the HDL comprises VHDL.

96. The machine-readable medium of claim 94, wherein the HDL comprises Verilog.

97. The machine-readable medium of claim 90, wherein the instructions further cause said processor to extract the information regarding the intended flow from one or more inline annotations embedded within the representation of the hardware design.

98. The machine-readable medium of claim 97, wherein the one or more inline annotations have a predetermined format including a comment start marker, a directive marker, and a directive name.

99. The machine-readable medium of claim 98, wherein the directive marker comprises "vx".

100. The machine-readable medium of claim 90, wherein the information regarding the intended flow of logical signals among one or more of the plurality of variables is provided by way of a file separate from that containing the representation of the hardware design.

101. The machine-readable medium of claim 90, wherein the instructions further cause said processor to report the existence of the one or more errors.

102. The machine-readable medium of claim 90, wherein the information regarding the intended flow of logical signals includes information regarding a state associated with a variable of the plurality of variables.

103. The machine-readable medium of claim 102, wherein the plurality of design verification checks include one or more rules relating to signal propagation, and wherein the method further comprises evaluating whether a signal associated with the variable is propagated in accordance with the one or more rules.

104. The machine-readable medium of claim 103, wherein one or more of the plurality of design verification checks are violated if the signal is capable of causing data flow activity in the hardware design while the variable is in an inactive state.

105. The machine-readable medium of claim 103, wherein one or more of the plurality of design verification checks are violated if the signal is incapable of causing data flow activity in the hardware design while the variable is in an active state.

106. A method comprising:

receiving a hardware design described in a hardware description language (HDL);

receiving one or more indications of design intent, the one or more indications of design intent include information regarding implied design intent that is inferred from the hardware design by applying one or more predetermined properties to signal propagation among one or more variables in the HDL, the one or more predetermined properties include a block enable property that relates to whether conditions enabling execution of a particular block of code in the HDL will never be satisfied;

producing a failure model by generating a plurality of design verification checks based upon the HDL and the design intent, each of the plurality of design verification checks representing a condition that must hold true in order for the hardware design to operate in accordance with the design intent; and detecting existence of one or more errors in the hardware design by analyzing each design verification check of the plurality of design verification checks.

107. The method of claim 106, wherein the one or more indications of design intent include information regarding expressed design intent explicitly conveyed by a designer by way of intent modeling semantics of the HDL.

108. The method of claim 106, wherein the one or more predetermined properties are based upon expected behaviors that should occur within standard design practices.

109. The method of claim 106, wherein the one or more predetermined properties include one or more of:
   an assignment execution property that relates to checking whether each logical value can be assigned to a variable in the representation through assignment operations appearing in the representation;
   a conflicting assignments property that relates to checking whether a wire in the hardware design is driven by multiple conflicting drivers;
   a constant value memory element property that relates to determining whether a memory element in the hardware design will always hold a constant value; and
   a constant value variable property that relates to determining whether a variable in the representation will always hold a constant value.

110. A method comprising:
   a step for receiving a hardware design described in a hardware description language (HDL);
   a step for receiving one or more indications of design intent, the one or more indications of design intent include information regarding implied design intent that is inferred from the hardware design by applying one or more predetermined properties to signal propagation among one or more variables in the HDL, the one or more predetermined properties include a block enable property that relates to whether conditions enabling execution of a particular block of code in the HDL will never be satisfied;
   a step for producing a failure model by generating a plurality of design verification checks based upon the HDL and the design intent, each of the plurality of design verification checks symptomatic of one or more errors in the hardware design; and
   a step for detecting existence of one or more errors in the hardware design by analyzing each design verification check of the plurality of design verification checks.

111. The method of claim 110, wherein the one or more indications of design intent include information regarding expressed design intent explicitly conveyed by a designer by way of intent modeling semantics of the HDL.

112. The method of claim 110, wherein the one or more predetermined properties are based upon expected behaviors that should occur within standard design practices.

113. The method of claim 110, wherein the one or more predetermined properties include one or more of:
   an assignment execution property that relates to checking whether each logical value can be assigned to a variable in the representation through assignment operations appearing in the representation;
   a conflicting assignments property that relates to checking whether a wire in the hardware design is driven by multiple conflicting drivers;
   a constant value memory element property that relates to determining whether a memory element in the hardware design will always hold a constant value; and
   a constant value variable property that relates to determining whether a variable in the representation will always hold a constant value.

114. An apparatus comprising:
   a means for receiving a hardware design described in a hardware description language (HDL);
   a means for receiving one or more indications of design intent, the one or more indications of design intent include information regarding implied design intent that is inferred from the hardware design by applying one or more predetermined properties to signal propagation among one or more variables in the HDL, the one or more predetermined properties include a block enable property that relates to whether conditions enabling execution of a particular block of code in the HDL will never be satisfied;
   a means for producing a failure model by generating a plurality of design verification checks based upon the HDL and the design intent, each of the plurality of design verification checks symptomatic of one or more errors in the hardware design; and
   a means for detecting existence of one or more errors in the hardware design by analyzing each design verification check of the plurality of design verification checks.

115. The apparatus of claim 114, wherein the one or more indications of design intent include information regarding expressed design intent explicitly conveyed by a designer by way of intent modeling semantics of the HDL.

116. The apparatus of claim 114, wherein the one or more indications of design intent comprise intended behavior of logical signals associated with the one or more variables in the HDL.

117. The apparatus of claim 114, wherein the one or more predetermined properties include one or more of:
   an assignment execution property that relates to checking whether each logical value can be assigned to a variable in the representation through assignment operations appearing in the representation;
   a conflicting assignments property that relates to checking whether a wire in the hardware design is driven by multiple conflicting drivers;
   a constant value memory element property that relates to determining whether a memory element in the hardware design will always hold a constant value; and
   a constant value variable property that relates to determining whether a variable in the representation will always hold a constant value.

118. A method comprising:
   receiving a representation of a hardware design and information regarding an intended behavior of logical signals associated with a plurality of variables in the representation, the information regarding the intended behavior of the logical signals comprises implied design intent that is inferred from the representation of the hardware design and a set of predetermined properties including one or more of:
   a block enable property that relates to whether conditions enabling execution of a particular block of code in the representation will never be satisfied,
   an assignment execution property that relates to checking whether each logical value can be assigned to a variable in the representation through assignment operations appearing in the representation,
   a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

inferring existence of one or more errors in the hardware design based upon the information regarding the intended behavior of the logical signals by translating the information regarding the intended behavior of the logical signals into a plurality of design verification checks, each of the plurality of design verification checks representing a condition that must hold true in order for the hardware design to operate in accordance with the intended behavior of logical signals, and determining if one or more of the plurality of design verification checks are violated by the hardware design.

119. The method of claim 118, wherein the hardware design is expressed in a high-level programming language.

120. The method of claim 119, wherein the high-level programming language comprises C.

121. The method of claim 119, wherein the high-level programming language comprises C++.

122. The method of claim 118, wherein the hardware design is expressed in a hardware description language (HDL).

123. A method comprising:

a step for receiving a representation of a hardware design and information regarding an intended behavior of logical signals associated with a plurality of variables in the representation, the information regarding the intended behavior of the logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

a step for inferring existence of one or more errors in the hardware design based upon the information regarding the intended behavior of the logical signals by translating the information regarding the intended behavior of the logical signals into a plurality of design verification checks, each of the plurality of design verification checks representing a condition that must hold true in order for the hardware design to operate in accordance with the intended behavior of the logical signals, and determining if one or more of the plurality of design verification checks are violated by the hardware design.

124. The method of claim 123, wherein the hardware design is expressed in a high-level programming language.

125. The method of claim 124, wherein the high-level programming language comprises C.

126. The method of claim 124, wherein the high-level programming language comprises C++.

127. The method of claim 123, wherein the hardware design is expressed in a hardware description language (HDL).

128. A method comprising:

receiving a representation of a hardware design and information regarding an intended behavior of logical signals associated with a plurality of variables in the representation, the information regarding the intended behavior of the logical signals indicating one or more of desired temporal behavior and desired functional behavior of the logical signals from which inferences are drawn regarding the integrity of data conveyed by the logical signals, the information regarding the intended behavior of the logical signals comprises implied design intent that is inferred from the representation of the hardware design and a set of predetermined properties including one or more of:

a block enable property that relates to whether conditions enabling execution of a particular block of code in the representation will never be satisfied, an assignment execution property that relates to checking whether each logical value can be assigned to a variable in the representation through assignment operations appearing in the representation, a conflicting assignments property that relates to checking whether a wire in the hardware design is driven by multiple conflicting drivers, a constant value memory element property that relates to determining whether a memory element in the hardware design will always hold a constant value, and a constant value variable property that relates to determining whether a variable in the representation will always hold a constant value;

translating the information regarding the intended behavior of the logical signals into a plurality of design verification checks, each of the plurality of design verification checks representing a condition that must hold true in order for the hardware design to operate in accordance with the intended behavior of the logical signals; and detecting existence of one or more errors in the hardware design by determining if one or more of the plurality of checks can be violated by the hardware design.

129. The method of claim 128, wherein the information regarding the intended behavior of the logical signals is captured from semantics of the representation.

130. The method of claim 129, wherein the information regarding the intended behavior of the logical signals is determined by interpreting context of the semantics within a control flow structure associated with the representation.

131. The method of claim 128, wherein the representation comprises a hardware description language (HDL).

132. The method of claim 131, wherein the HDL comprises VHDL.

133. The method of claim 131, wherein the HDL comprises Verilog.

134. The method of claim 128, further comprising extracting the information regarding the intended behavior from one or more inline annotations embedded within the representation of the hardware design.

135. The method of claim 134, wherein the one or more inline annotations have a predetermined format including a comment start marker, a directive marker, and a directive name.

136. The method of claim 128, wherein the information regarding the intended behavior of the logical signals is provided by way of a file separate from that containing the representation of the hardware design.

137. The method of claim 128, further comprising reporting the existence of the one or more errors.

138. The method of claim 128, wherein the information regarding the intended behavior of the logical signals includes information regarding a state associated with a variable of the plurality of variables.

139. The method of claim 138, wherein the plurality of design verification checks include one or more rules relating to signal propagation, and wherein the method further comprises evaluating whether a signal associated with the variable is propagated in accordance with the one or more rules.

140. The method of claim 139, wherein one or more of the plurality of design verification checks are violated if the signal is capable of causing data flow activity in the hardware design while the variable is in an inactive state.

141. The method of claim 139, wherein one or more of the plurality of design verification checks are violated if the signal is incapable of causing data flow activity in the hardware design while the variable is in an active state.

142. A method comprising:
a step for receiving a representation of a hardware design and information regarding an intended behavior of logical signals associated with a plurality of variables in the representation, the information regarding the intended behavior of the logical signals indicating one or more of desired temporal behavior and desired functional behavior of the logical signals from which inferences are drawn regarding the integrity of data conveyed by the logical signals, the information regarding the intended behavior of the logical signals comprises implied design intent that is inferred from the representation of the hardware design and a set of predetermined properties including one or more of:
a block enable property that relates to whether conditions enabling execution of a particular block of code in the representation will never be satisfied,
an assignment execution property that relates to checking whether each logical value can be assigned to a variable in the representation through assignment operations appearing in the representation,
a conflicting assignments property that relates to checking whether a wire in the hardware design is driven by multiple conflicting drivers,
a constant value memory element property that relates to determining whether a memory element in the hardware design will always hold a constant value, and
a constant value variable property that relates to determining whether a variable in the representation will always hold a constant value;
a step for translating the information regarding the intended behavior of the logical signals into a plurality of design verification checks, each of the plurality of design verification checks representing a condition that must hold true in order for the hardware design to operate in accordance with the intended behavior of the logical signals; and
a step for detecting existence of one or more errors in the hardware design by determining if one or more of the plurality of checks can be violated by the hardware design.

143. The method of claim 142, wherein the information regarding the intended behavior of the logical signals is captured from semantics of the representation.

144. The method of claim 143, wherein the information regarding the intended behavior of the logical signals is determined by interpreting context of the semantics within a control flow structure associated with the representation.

145. The method of claim 142, wherein the representation comprises a hardware description language (HDL).

146. The method of claim 145, wherein the HDL comprises VHDL.

147. The method of claim 145, wherein the HDL comprises Verilog.

148. The method of claim 142, further comprising extracting the information regarding the intended behavior from one or more inline annotations embedded within the representation of the hardware design.

149. The method of claim 148, wherein the one or more inline annotations have a predetermined format including a comment start marker, a directive marker, and a directive name.

150. The method of claim 142, wherein the information regarding the intended behavior of the logical signals is provided by way of a file separate from that containing the representation of the hardware design.

151. The method of claim 142, further comprising reporting the existence of the one or more errors.

152. The method of claim 142, wherein the information regarding the intended behavior of the logical signals includes information regarding a state associated with a variable of the plurality of variables.

153. The method of claim 152, wherein the plurality of design verification checks include one or more rules relating to signal propagation, and wherein the method further comprises evaluating whether a signal associated with the variable is propagated in accordance with the one or more rules.

154. The method of claim 153, wherein one or more of the plurality of design verification checks are violated if the signal is capable of causing data flow activity in the hardware design while the variable is in an inactive state.

155. The method of claim 153, wherein one or more of the plurality of design verification checks are violated if the signal is incapable of causing data flow activity in the hardware design while the variable is in an active state.

156. A method comprising:
a step for receiving a representation of a hardware design and information regarding an intended behavior of logical signals associated with a plurality of variables in the representation, the information regarding the intended behavior of the logical signals comprises implied design intent that is inferred from the hardware design and a set of predetermined properties including one or more of:
a block enable property that relates to whether conditions enabling execution of a particular block of code in the representation will never be satisfied,
an assignment execution property that relates to checking whether each logical value can be assigned to a variable in the representation through assignment operations appearing in the representation,
a conflicting assignments property that relates to checking whether a wire in the hardware design is driven by multiple conflicting drivers,
a constant value memory element property that relates to determining whether a memory element in the hardware design will always hold a constant value, and a constant value variable property that relates to determining whether a variable in the representation will always hold a constant value; and a step for inferring existence of one or more errors in the representation of the hardware design based upon the information regarding the intended behavior of the logical signals by translating the information regarding the intended behavior of the logical signals into a plurality of design verification checks, each of the plurality of design verification checks representing a condition that must hold true in order for the hardware design to operate in accordance with the intended behavior of the logical signals, and determining whether one or more of the plurality of design verification checks are violated by the hardware design.

157. The method of claim 156, further comprising identifying one or more key points in the hardware design based upon the information regarding the intended behavior of the logical signals.

158. The method of claim 156, wherein the hardware design is expressed in a hardware description language (HDL).

159. The method of claim 158, wherein information regarding the intended behavior of the logical signals is captured from semantics of the HDL.

160. The method of claim 159, further including determining the intended behavior of the logical signals by interpreting the information regarding the intended behavior based upon its context.

161. The method of claim 160, wherein the context of the information regarding the intended behavior comprises its position within a control flow structure associated with the representation of the hardware design.

162. The method of claim 156, further including extracting the information regarding the intended behavior from one or more inline annotations embedded within the representation of the hardware design.

163. The method of claim 156, wherein the information regarding the intended behavior is provided by way of a file separate from that containing the hardware design.

164. The method of claim 156, wherein the information regarding the intended behavior includes information regarding expressed design intent explicitly conveyed by a designer by way of intent modeling semantics of the representation.

165. The method of claim 156, further comprising embedding one or more verification entities into the hardware design during verification processing to facilitate verification and modeling of the intended behavior of the logical signals.

* * * * *